(12) United States Patent
Chaput et al.

(10) Patent No.: US 10,720,841 B2
(45) Date of Patent: Jul. 21, 2020

(54) AREA EFFICIENT SINGLE-ENDED ANALOG-TO-DIGITAL CONVERTER

(71) Applicant: President and Fellows of Harvard College, Cambridge, MA (US)

(72) Inventors: Simon Chaput, Magog (CA); Gu-Yeon Wei, Boston, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 16/483,055

(22) PCT Filed: Feb. 2, 2018

(86) PCT No.: PCT/US2018/016636
§ 371 (c)(1),
(2) Date: Aug. 2, 2019

(87) PCT Pub. No.: WO2018/144856
PCT Pub. Date: Aug. 9, 2018

(65) Prior Publication Data
US 2020/0014395 A1 Jan. 9, 2020

Related U.S. Application Data

(60) Provisional application No. 62/454,230, filed on Feb. 3, 2017.

(51) Int. Cl.
H03M 1/66 (2006.01)
H02M 3/158 (2006.01)
H01L 41/04 (2006.01)
H02M 1/08 (2006.01)
H02M 3/157 (2006.01)
(Continued)

(52) U.S. Cl.
CPC ........ *H02M 3/1582* (2013.01); *H01L 41/042* (2013.01); *H02M 1/083* (2013.01); *H02M 3/157* (2013.01); *H02M 3/33576* (2013.01); *H02M 3/33584* (2013.01); *H03M 1/462* (2013.01); *H03M 1/466* (2013.01); *H02M 2001/007* (2013.01); *H02M 2001/0009* (2013.01); *H02N 1/006* (2013.01); *H02N 2/065* (2013.01)

(58) Field of Classification Search
CPC ... H03M 1/466; H03M 1/462; H03M 3/33576
USPC .......................... 341/144, 155, 163, 153, 172
See application file for complete search history.

(56) References Cited

U.S. PATENT DOCUMENTS 3,922,526 A 11/1975 Cochran
5,402,329 A 5/1995 Wittenbreder
(Continued)

OTHER PUBLICATIONS

International Search Report and Written Opinion for PCT/US18/16636, dated Apr. 17, 2018.
(Continued)

*Primary Examiner* — Peguy Jean Pierre
(74) *Attorney, Agent, or Firm* — Peter A. Nieves; Sheehan Phinney Bass & Green PA

(57) ABSTRACT

A single ended n-bit hybrid digital-to-analog converter is configured to receive as an input an analog signal and produce an n-bit digital output. The converter includes a split main sub-digital-to-analog converter capacitor array, a most significant bit capacitor array, and a main capacitor array. A coupling capacitor couples the main array to the split main sub-digital-to-analog convert.

2 Claims, 27 Drawing Sheets

(51) Int. Cl.
*H02M 3/335* (2006.01)
*H03M 1/46* (2006.01)
*H02M 1/00* (2006.01)
*H02N 1/00* (2006.01)
*H02N 2/06* (2006.01)

(56) References Cited

U.S. PATENT DOCUMENTS

| | | | |
|---|---|---|---|
| 5,684,487 A | 11/1997 | Timko | |
| 6,566,908 B2 | 5/2003 | Mack | |
| 6,720,896 B2 * | 4/2004 | Semmler | H03M 1/1023 341/120 |
| 7,102,380 B2 | 9/2006 | Kao | |
| 9,467,638 B2 * | 10/2016 | Chen | H04N 5/3742 |
| 2007/0109168 A1 * | 5/2007 | Hennessy | H03M 1/0639 341/155 |
| 2007/0255271 A1 | 11/2007 | Dabney et al. | |
| 2008/0234954 A1 | 9/2008 | Foran | |
| 2011/0115658 A1 | 5/2011 | Carreau | |
| 2012/0268969 A1 | 10/2012 | Cuk | |
| 2012/0326900 A1 | 12/2012 | Wu et al. | |
| 2013/0027006 A1 | 1/2013 | Holloway et al. | |
| 2013/0044015 A1 | 2/2013 | Reinhold et al. | |
| 2013/0106629 A1 | 5/2013 | Nys et al. | |
| 2014/0203761 A1 | 7/2014 | Paparrizos et al. | |
| 2014/0334192 A1 | 11/2014 | Meyer et al. | |
| 2016/0226507 A1 * | 8/2016 | Baek | H03M 1/38 |
| 2016/0231759 A1 | 8/2016 | Lofthouse | |
| 2017/0012622 A1 | 1/2017 | Peter | |
| 2017/0012636 A1 | 1/2017 | Venca et al. | |
| 2017/0033800 A1 * | 2/2017 | Yuan | H03M 1/1245 |

OTHER PUBLICATIONS

International Search Report and Written Opinion for PCT/US18/16646, dated May 11, 2018.

* cited by examiner

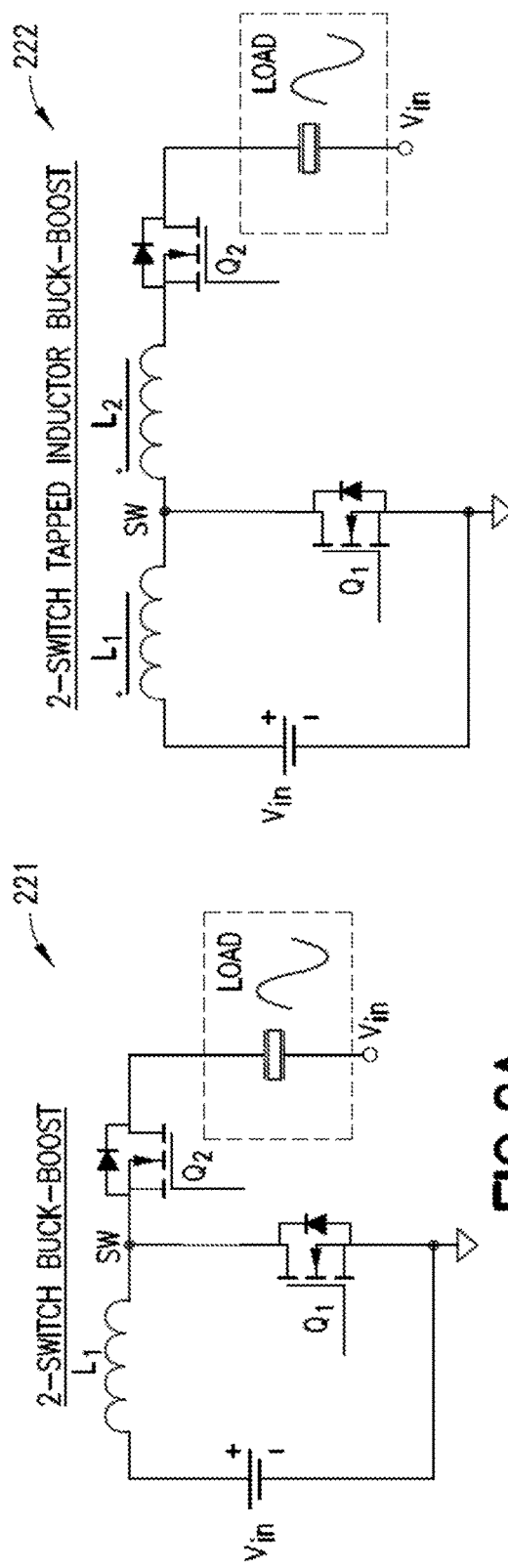

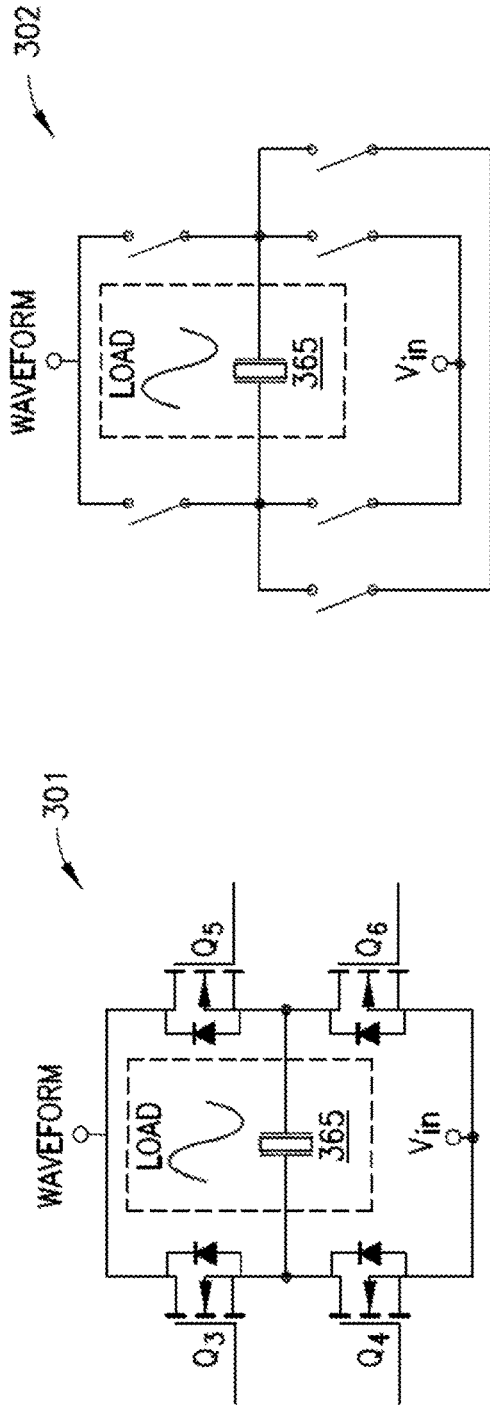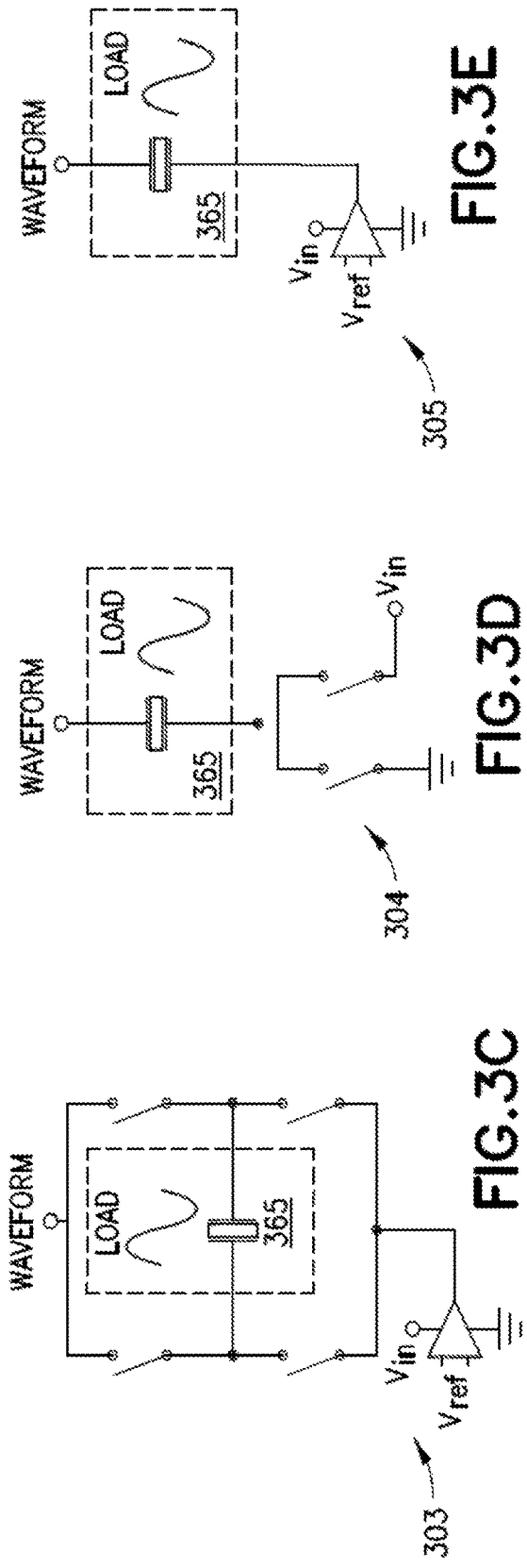

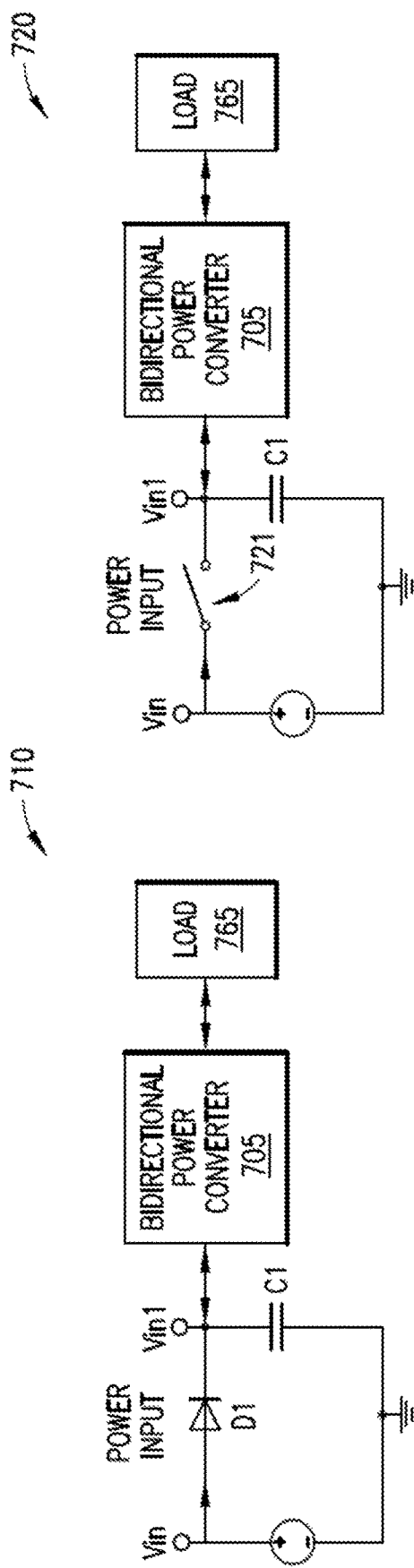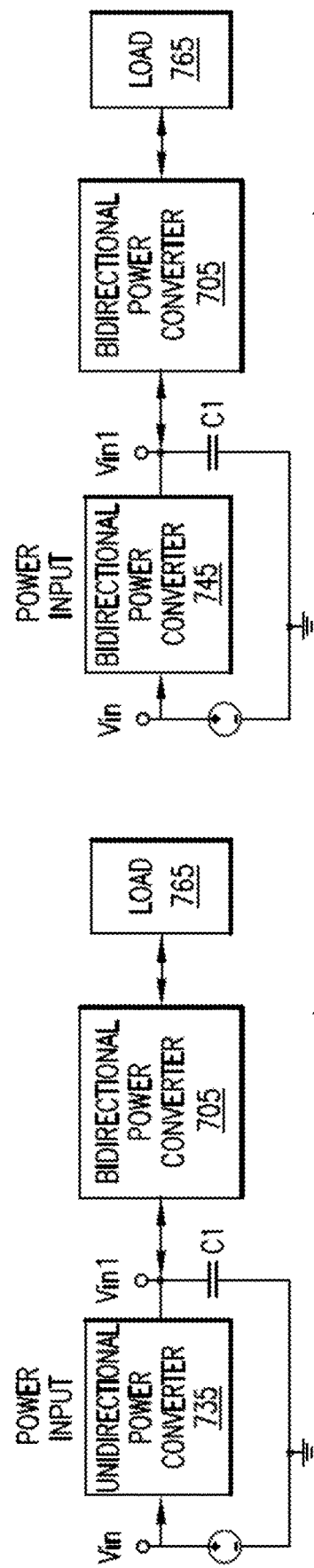

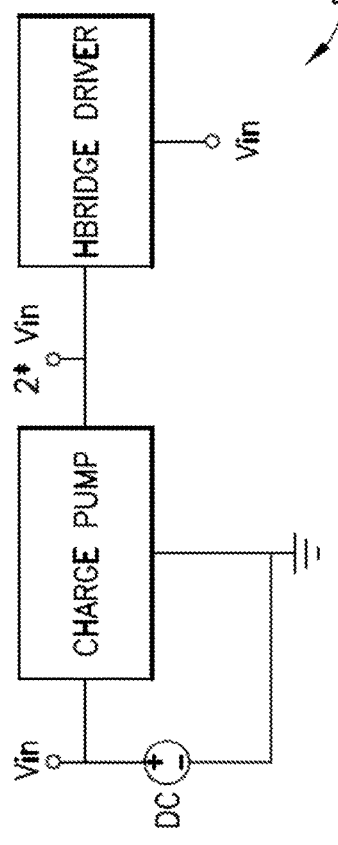
FIG. 8
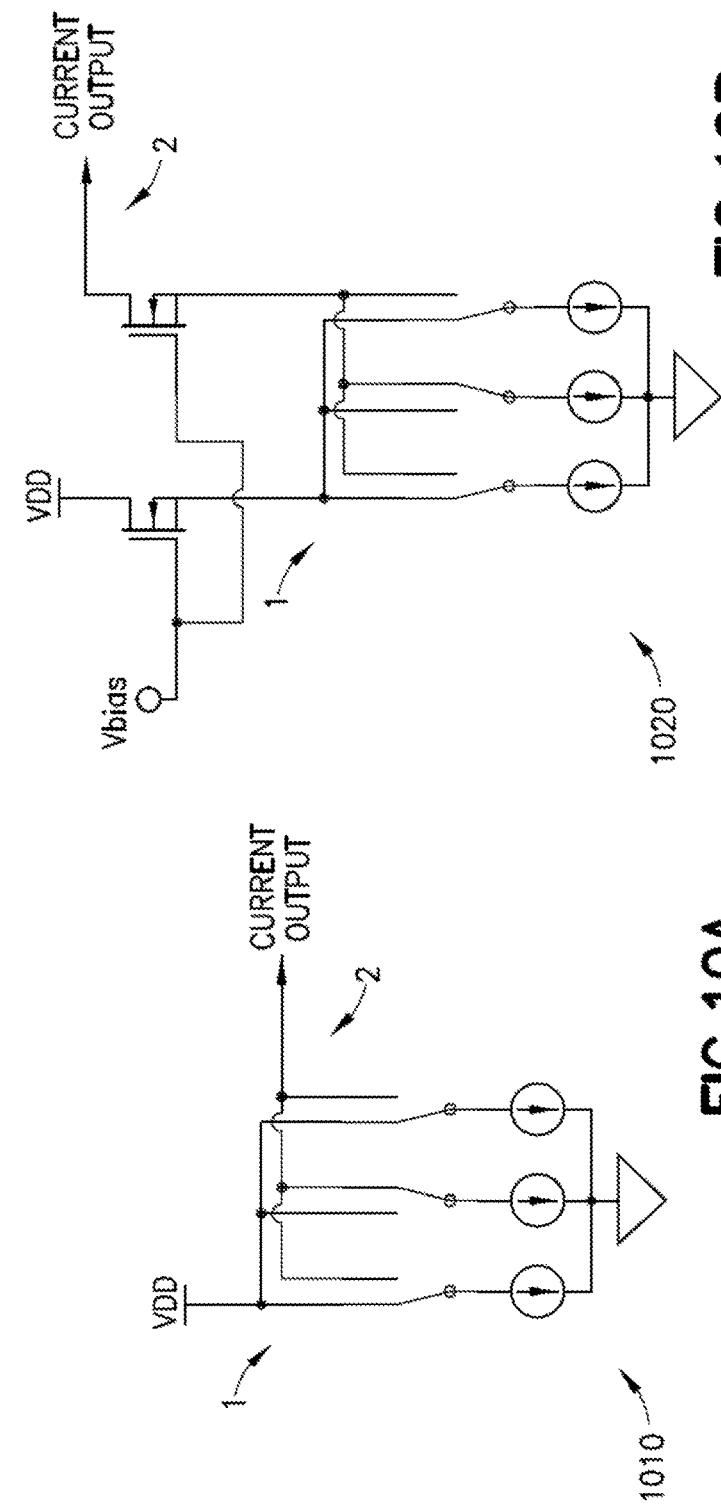
FIG. 10A
FIG. 10B

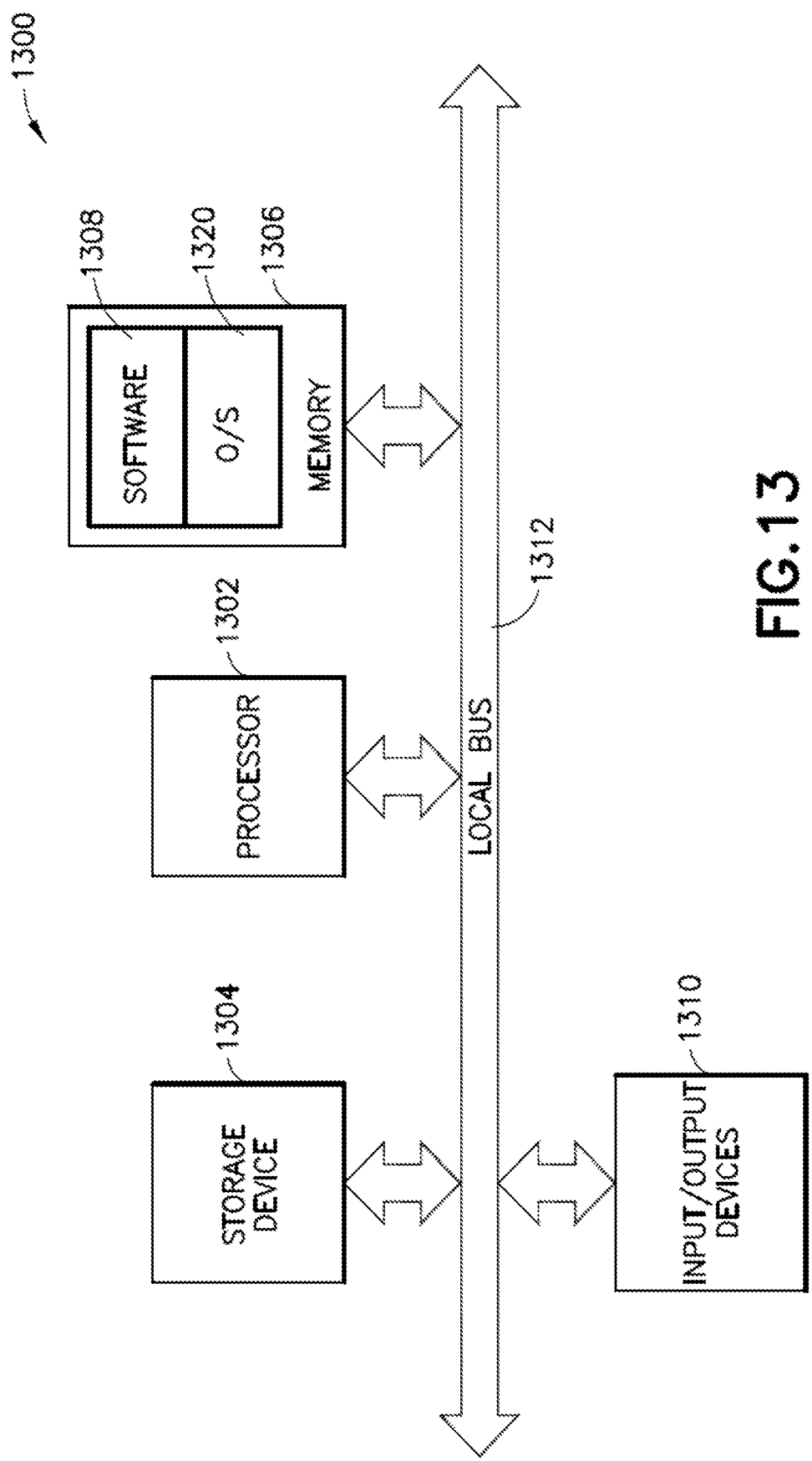

AREA EFFICIENT SINGLE-ENDED ANALOG-TO-DIGITAL CONVERTER

CROSS-REFERENCE TO RELATED APPLICATIONS

This application claims the benefit of U.S. Provisional Patent Application Ser. No. 62/454,230, filed Feb. 3, 2017, entitled "Highly Integrated High Voltage Actuator Driver," which is incorporated by reference herein in its entirety.

FIELD OF THE INVENTION

The present invention relates to circuitry for high voltage capacitive actuators, in particular this invention relates to an area and power efficient analog-to-digital converter (ADC).

BACKGROUND OF THE INVENTION

Active cooling systems, such as fans, face multiple challenges when implemented in ultrathin devices, such as tablet or laptop computers. General Electric (GE) has developed a cooling device using two piezoelectric membranes, called a Dual Piezoelectric Cooling Jet (DCJ). The piezoelectric membranes are electrically activated, causing them to expand and contract, forming a cavity that spills air at a high velocity, for example, like a bellows. However, the DCJ is an energy intensive device, and a DCJ driver may be large and expensive. Further, the DCJ membranes operate like a speaker/transducer, so that any oscillations within the human hearing band (approximately 200 Hz to 20 KHz), for example, due to noise or distortion in the driver signal, may be audibly detected.

FIG. 19 shows a prior art topology for a single-phase voltage source inverter for renewable energy sources. The circuit includes an input stage, a buck-boost stage, and an unfolding stage. It was implemented in discrete parts due to the high power to process. This circuit is based on a typical PI controller or Energy controller and very low fixed frequency switching. This typically leads to very high distortion level (>5%), low power efficiency at low power output and very limited boost voltage ratio ≈3.5 (Vout/Vin).

Certain applications for an actuator driver, for example flying microrobots, are typically severely power and weight constrained applications that rely on capturing and processing wide voltage range single ended analog inputs from various sensors (e.g., optical flow cameras, accelerometers, gyroscopes, etc.) to enable autonomous flight.

Actuator drivers may incorporate an analog-to-digital converter (ADC), which present challenges due to the relatively high power consumption and/or large circuit footprint of ADCs and/or high electrical noise, for example, due to the close proximity of the ADC input to high-voltage switching nodes. Many techniques have been presented to reduce successive approximation register (SAR) ADC power consumption, but most reduce power consumption at the expense of increased area. Therefore, there is a need in the industry to address one or more of the abovementioned shortcomings.

SUMMARY OF THE INVENTION

Embodiments of the present invention provide a single ended n-bit hybrid digital-to-analog converter configured to receive as an input an analog signal and produce an n-bit digital output. The converter includes a split main sub-digital-to-analog converter capacitor array, a most significant bit capacitor array, and a main capacitor array. A coupling capacitor couples the main array to the split main sub-digital-to-analog convert.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention. It should be noted that schematic drawings may be simplified, for example, by omitting commonly known and/or trivial elements not pertinent to the understanding of the inventive aspects of the illustrated embodiments.

FIG. 2A is a circuit diagram for a 2-switch buck-boost driver first alternative to the buck-boost driver of FIG. 1.

FIG. 2B is a circuit diagram for a 2-switch tapped inductor buck-boost driver second alternative to the buck-boost driver of FIG. 1.

FIG. 2C is a circuit diagram for a 2-switch flyback buck-boost driver third alternative to the buck-boost driver of FIG. 1.

FIG. 2D is a circuit diagram for a 2-switch flyback buck-boost low side secondary switch fourth alternative to the buck-boost driver of FIG. 1.

FIG. 3A is a circuit diagram illustrating an output configuration with a full-bridge connected to a capacitive load.

FIG. 3B is a circuit diagram illustrating an output configuration in which a full-bridge with discrete voltage reference choices is connected to a capacitive load.

FIG. 3C is a circuit diagram illustrating an output configuration in which a full-bridge with an analog variable reference is connected to a capacitive load.

FIG. 3D is a circuit diagram illustrating an output configuration with load connected to a discrete variable reference.

FIG. 3E is a circuit diagram illustrating an output configuration with a load connected to variable analog reference.

FIG. 6A illustrates a first alternative embodiment of the unidirectional power input.

FIG. 6B illustrates a second alternative embodiment of the unidirectional power input where losses in the input are lowered by using an active switch.

FIG. 6C illustrates a third alternative embodiment of the unidirectional power input where, more generally, any power converter can be used.

FIG. 6D illustrates a first alternative embodiment of the converter with a bi-directional converter for the input.

FIG. 8 is a schematic diagram of an exemplary floating low voltage supply.

FIG. 10A is a circuit diagram of a standard current DAC converter.

FIG. 10B is a circuit diagram of an enhanced current DAC for rapid settling of the current output node.

FIG. 13 is a schematic diagram illustrating an example of a controller for the present invention.

DETAILED DESCRIPTION

Figure 1:
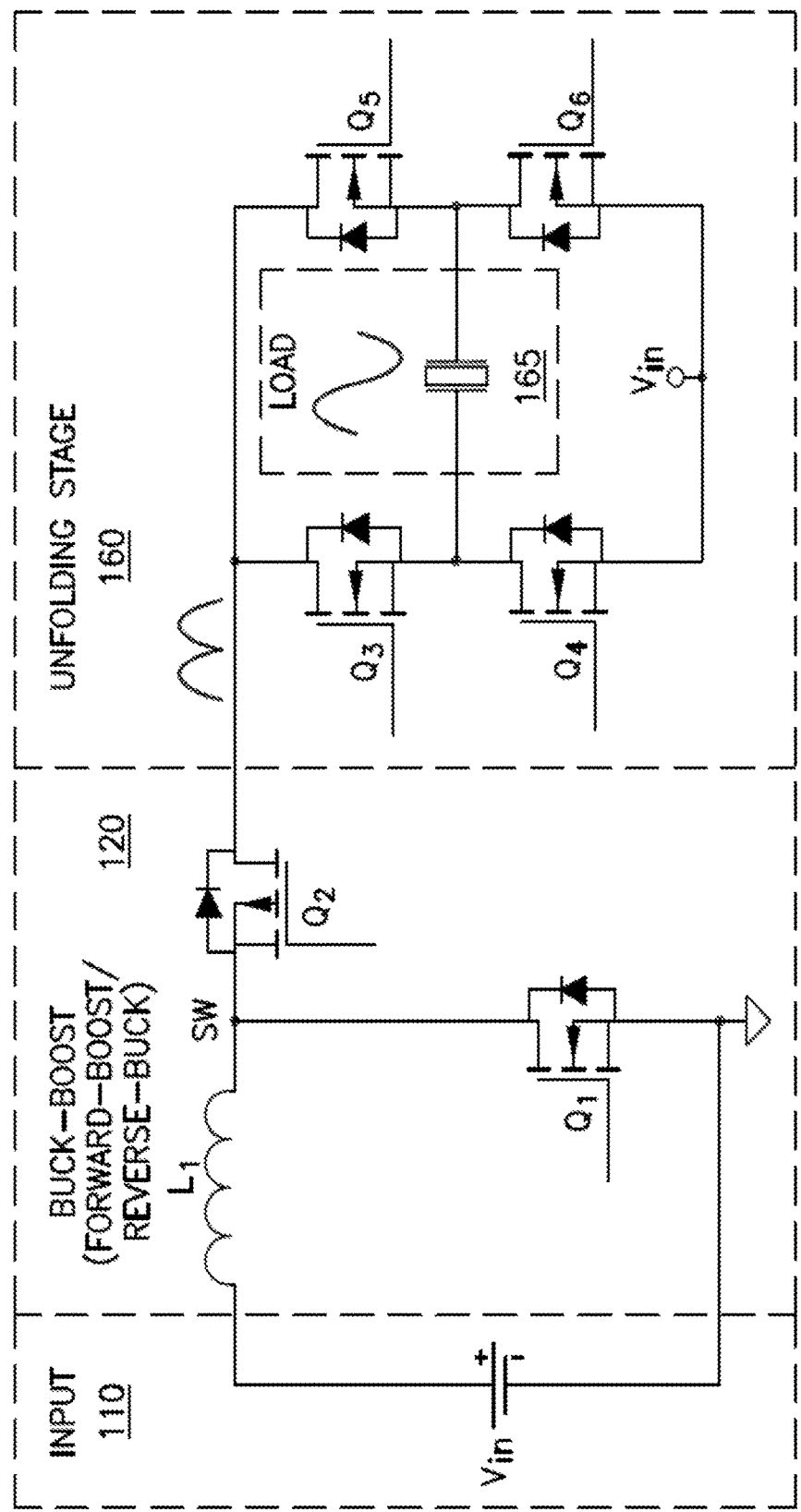
FIG. 1 is a schematic diagram depicting an exemplary first embodiment driver topology.

Reference will now be made in detail to embodiments of the present invention, examples of which are illustrated in the accompanying drawings. Wherever possible, the same reference numbers are used in the drawings and the description to refer to the same or like parts.

Figure 19:
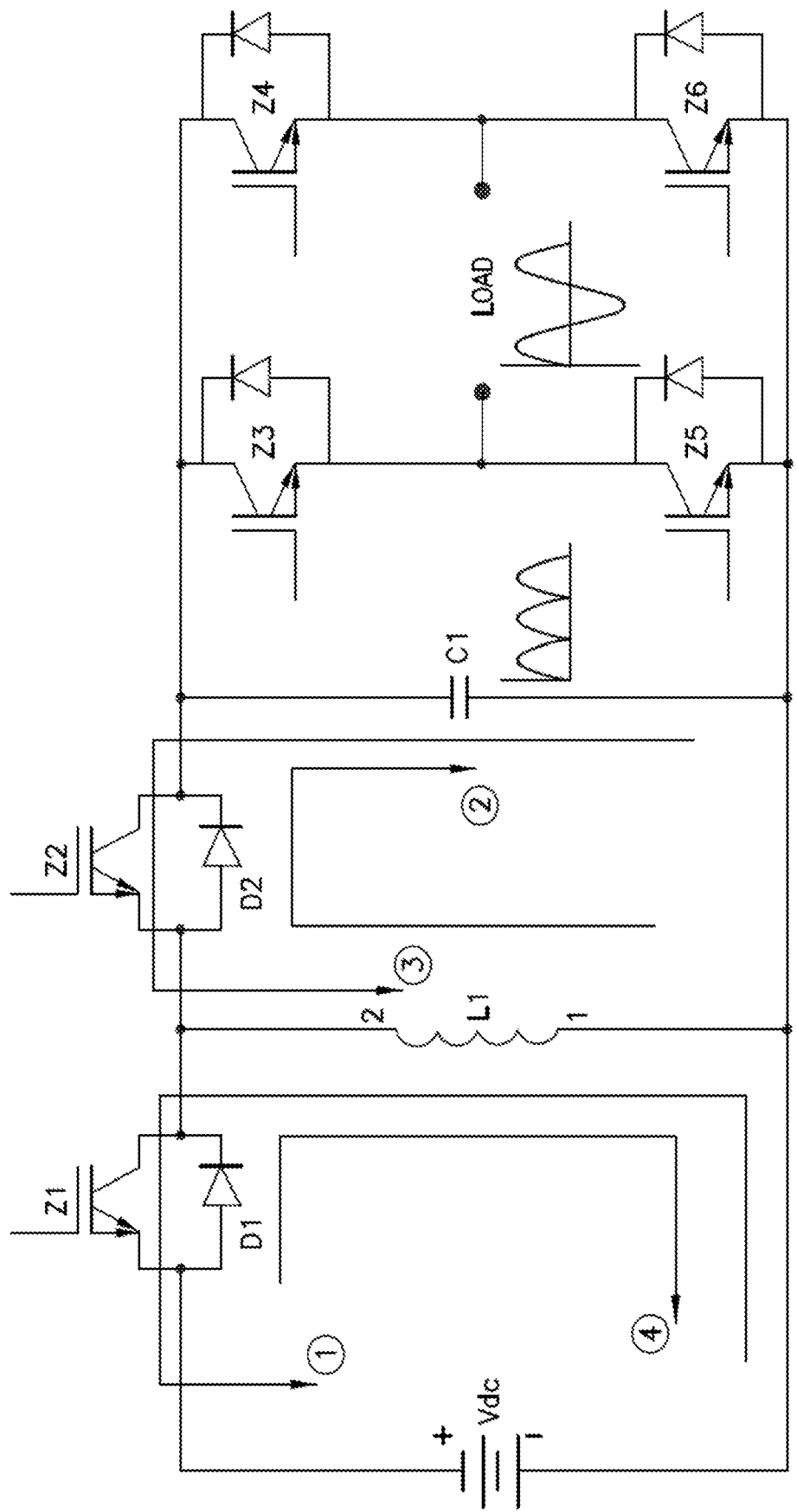
FIG. 19 is a schematic diagram depicting a prior art driver topology.

In contrast to the prior art driver shown in FIG. 19, embodiments of the driver under the present invention may boost a voltage ratio in excess of 10 and may achieve a distortion level lower than 1% while being very efficient at a low power output. Implementing the topology using discrete parts for a piezoelectric driver is not an option due to size and cost constraints, but a highly integrated topology is not straightforward as most CMOS processes cannot accommodate efficient bi-directional operation of the converter due to process limitations.

While the topology used in the present embodiments has similarities to the circuit of FIG. 19, the implementation of the topology in a single integrated circuit achieving significantly lower distortion and high power efficiency while used to drive capacitive load such as piezoelectric actuators is an important step forward to enable a variety of new applications such a high definition haptic feedback in mobile devices, piezo cooling fans, and piezo speakers among others.

Exemplary embodiments of a capacitive driver, for example, a driver for a dual piezoelectric cooling jet (DCJ), include a power converter configured to receive a DC input voltage $v_{in}$ as input and generate a clean folded sine waveform as an output, an unfolding stage referenced to $v_{in}$, configured to receive the clean folded sine waveform from the converter and unfold the folded sine waveform into a sinusoidal waveform, and a controller configured to control the driver. The converter may be configured for bi-directional operation.

FIG. 1 shows an exemplary first embodiment 100 of a topology for a single-phase voltage source. The first embodiment 100 may be described as a pseudo-dc-link bi-directional driver with a single inductor $L_1$, that provides a total harmonic distortion (THD) lower than 0.5% and brings the power close to the effective power used by the load. Exemplary results from a prototype produced a total power of 64.04 mW and a THD+N of 0.38% for a 100 Vpp 150 Hz sinusoid in a 150 nF load from a 3.6 V power supply.

The circuit of the first embodiment 100 includes an input stage 110, a forward-boost/reverse-buck stage 120, and an unfolding stage 160. The circuit of the first embodiment 100 may be implemented in discrete parts due to the high power to process. The input stage may include a voltage source $V_1$, such as a battery. The input stage is described in more detail below (see FIGS. 7A-7D). The buck-boost stage 120 is a forward-boost/reverse-buck converter that generates a clean folded sine waveform. The buck-boost stage 120 includes an inductor $L_1$ connected to $V_1$, a first low side switch Q1 connected between $L_1$ and ground, and a second switch Q2 connected between $L_1$ and the unfolding stage 160. The gate of the transistor in the first switch Q1 and the second switch may be connected to a gate driver (not shown).

While the first embodiment is described being used for sine waveforms, persons having ordinary skill in the art will appreciate the embodiments described herein may operate upon arbitrary and complex waveforms, for example, square, triangular, AM modulated, FM modulated, and are not limited to operating upon sine waveforms.

The inductor $L_1$, for example, with a DCJ, may be a 100 μH inductor. The inductor $L_1$ value may be selected in order to (1) achieve a target distortion (lower inductance increases switching frequency and decreases distortion/THD+N), and/or (2) minimize the switching frequency. In general, a lower switching frequency corresponds to lower power consumption.

The switches Q1 and Q2 may be of the same type, which may be the most practical choice for an integrated circuit (IC) implementation, although embodiments with mixed switches may be used. The switches Q1 and Q2 may be, for example, GaN, PMOS, MEMS switches, among other possible switches.

The unfolding stage 160 is referenced to $V_1$ instead of GND. The unfolding stage includes a load 165, for example, a capacitor or a piezoelectric cooling jet, and switches Q3, Q4, Q5, and Q6. Therefore, to obtain 0 V differential, the output and input voltages are equal. Increasing the output voltage across the load 165 above the input voltage $V_1$ creates the signal amplitude. Polarity of the output waveform may be selected by the configuration of the unfolding stage 160. Consequently, using a 2-switch boost converter topology of the buck-boost stage 120 as power stage is sufficient since the input voltage only needs to be stepped up.

Bi-directional operation of the buck-boost stage 120 allows energy efficient control of the capacitive load 165. A full-bridge configuration is referenced to the input voltage ($V_{in}$) of the input stage 110 instead of ground, and unfolds the signal into a sinusoidal waveform across the load 165 of the unfolding stage 160.

The maximum output voltage may have a value of $V_{in}$+$V_p$, where $V_p$ is the differential output signal amplitude. That voltage overhead $V_{in}$ has limited effect on system efficiency. The current passing through the load returns to $V_{in}$, not to GND. Thus, no direct power dissipation is linked to the voltage overhead. Nevertheless, there may be a small penalty due to the slightly lower efficiency of the converter 100 at a higher conversion ratio.

Given that the power processed by the converter 100 of the first embodiment is on the order of 100 mW with output voltage beyond 50 V, both DC and switching losses are important. Operating the converter 100 in borderline conduction mode (BCM) provides a good trade-off to minimize both. In this mode, the current flowing through the inductor $L_1$ returns back to zero at the end of a switching cycle and then starts to ramp up immediately for the next cycle. Compared to continuous conduction mode (CCM), BCM provides the opportunity for zero voltage switching (ZVS) thereby reducing switching losses ($\propto fCV^2$) where f is the switching frequency, C is the parasitic capacitance at the switching node and V is the voltage difference between the minimum and maximum voltage value at the switching node. Compared to discontinuous conduction mode (DCM), the first embodiment 100 offers lower root mean square (RMS) current thereby reducing DC losses ($\propto I_{rms}^2 R$), where $I_{rms}$ is the root-mean-squared current and R the resistance in the current path.

The following describes BCM and its limitations in converters with high conversion ratio as per the first embodiment 100. In this case, the conversion ratio goes up to 14.9 for a 50 Vac output from a 3.6 V input. In FIG. 18A a typical waveform of the converter 100 operating in boost mode is presented. First, Q1 turns on and the inductor $L_1$ current ramps up linearly. When Q1 turns off the voltage at the switching node increases to the output voltage value. Here, the body diode of Q2 turns on and charges the output. When the inductor $L_1$ current reaches 0, the diode turns off and the switching node voltage $V_{SW}$ starts to oscillate. In the first embodiment 100, since the boost converter voltage gain is most of the time larger than 2, $V_{SW}$ decreases to a little bit less than 0 and turns on the body diode of Q1. Thereupon, Q1 turns on again under zero voltage switching condition (ZVS), thus reducing the switching losses associated to the parasitic capacitance at the switching node.

Figure 18B:
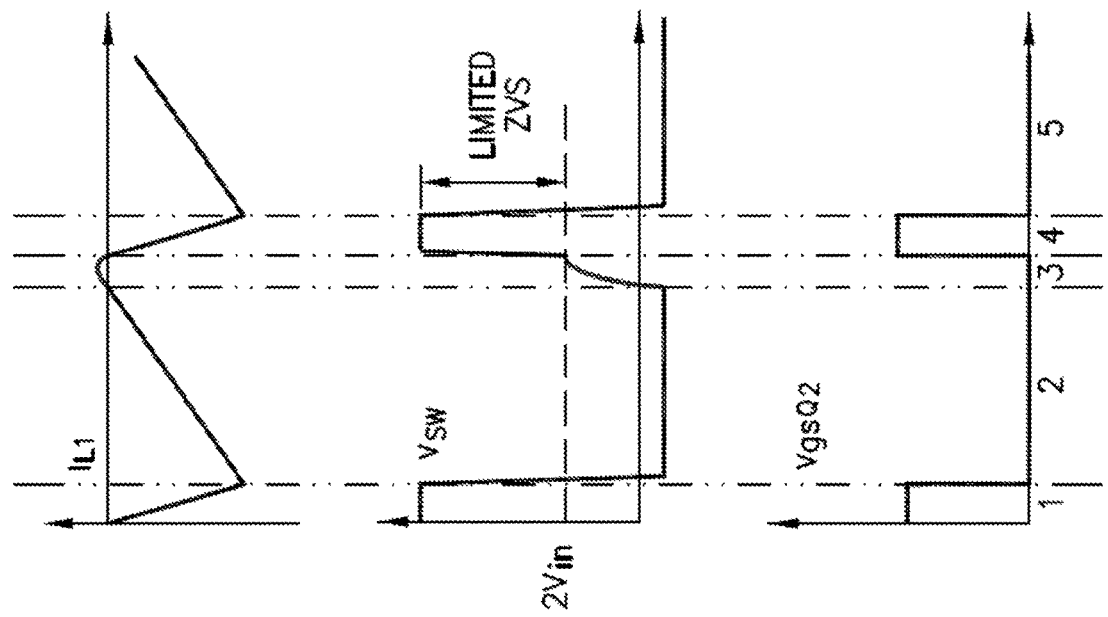
FIG. 18B is a plot diagram of waveforms of the converter of FIG. 1 in regular buck mode.
Figure 18A:
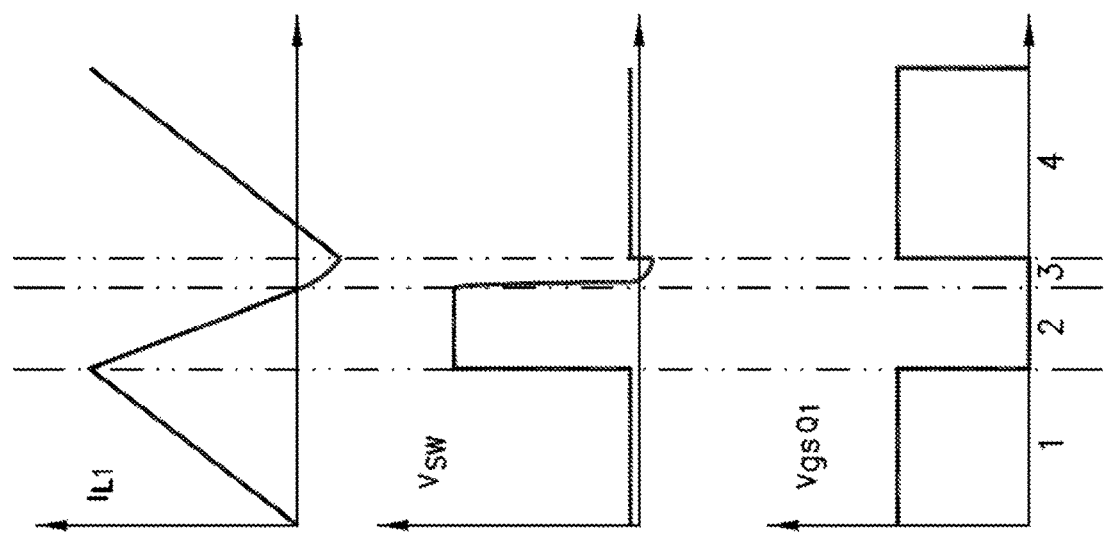
FIG. 18A is a plot diagram of waveforms of the converter of FIG. 1 in boost mode.

FIG. 18B shows a similar case for the buck mode. Switch Q2 turns on and $V_{SW}$ equals the output voltage while the inductor $L_1$ current magnitude increases. When Q2 turns off, $V_{SW}$ goes to GND and Q1 body diode turns on. In this case, the diode voltage drop creates non-negligible DC losses due to low $V_{in}$. When the inductor current reaches 0, the LC tank starts an oscillation. In this case the L is L1 and C is the sum of all parasitic capacitance at the node switch. $V_{SW}$ reaches a maximum at about 2 $V_{in}$ at which point Q2 turns on for the next cycle. The considerable difference between the output voltage and $V_1$ limits the power saving of that switching mechanism in buck mode.

When the buck-boost stage 120 is performing a buck operation, it is referred to herein as the buck converter 120. Operating the buck converter 120 as a pseudo resonant synchronous buck converter improves its general efficiency by virtually eliminating switching losses due to the SW node capacitance and reducing DC losses due to diode voltage drop. In this mode, the two switches are used in the buck mode. When Q2 turns off, Q1 turns on in ZVS condition. Instead of going through the diode, the inductor $L_1$ current goes through Q1 which reduces DC losses. Then Q1 stays on until the inductor accumulates enough energy to charge $V_{SW}$ to $V_{out}$. When Q1 turns off, $V_{SW}$ rings to $V_{out}$ and Q2 is turned on under ZVS condition thus reducing switching losses.

Alternative circuit blocks shown in FIGS. 2A-2D and described below may boost a voltage ratio between the output and input voltage in excess of 10:1 and may achieve a distortion level lower than 1% while being very efficient at a low power output. Implementing the topology as a discrete part for a piezoelectric driver may involve practical challenges due to size and cost constraints, but integrating the topology may not be straightforward as most CMOS processes do not accommodate efficient bi-directional operation of the converter due to manufacturing process limitations.

While the topology used in the alternative embodiments of FIGS. 2A-2D have similarities to the circuit of FIG. 1, the topology may be implemented in a single integrated circuit (generally excepting inductor L) with significantly lower distortion and high power efficiency for driving a capacitive load such as a piezoelectric actuator. This is an important step forward to enable a variety of new applications.

The alternative embodiments of FIGS. 2A-2D use a two-switch power converter cell as a bi-directional driver to control a capacitive load with low distortion analog waveforms. To achieve the desired performance level, the 2-switch power converter is designed to ensure that the switching frequency is high enough to allow the output waveform to reach the low-distortion level targeted. The frequency required can be estimated by:

$$\text{Resolution} = \log_2 \frac{f_{SW}}{2 * f_{sig}} \quad \text{(Eq. 1)}$$

where $f_{SW}$ is the converter switching frequency and $f_{sig}$ is the frequency of the output signal. By standard analog theory, the resolution can be linked to an ideal distortion level.

FIGS. 2A-2D depict four examples of alternative embodiments of two-switch power converters that may be used to directly generate the output waveform to control a capacitive load. FIG. 2A is a circuit diagram depicting a driver topology for a 2-switch buck-boost converter 221. The 2-switch buck-boost converter 221 does not require a transformer or coupled inductor and may be used directly to drive a unipolar signal (always above 0) on the load. FIG. 2B is a circuit diagram depicting a driver topology for a 2-switch tapped inductor buck-boost converter 222. FIG. 2C is a circuit diagram depicting a driver topology for a 2-switch flyback buck-boost converter 223. FIG. 2D is a circuit diagram depicting a driver topology for a 2-switch flyback buck-boost low side secondary switch converter 223. FIGS. 2B, 2C and 2D use the same principle as FIG. 2A. They may be preferable to 2A when the output voltage is higher as they may achieve lower power. The choice of the implementation depends upon the exact requirements for the application (e.g. size, power, fabrication process). The alternative converters 221-224 demonstrate that a capacitive load requiring low distortion analog waveform may be driven directly from a 2-switch bi-directional converter. The exact topology chosen may be application specific. The converter 221 may use synchronous switching, regular switching, or a combination of both to achieve the best performance for the application.

FIGS. 3A-3E present different configurations 301-305 of the unfolding stage 160 (FIG. 1), or output stage, that may be used for different driver embodiments to interface with the capacitive load 365. A standard full-bridge configuration 301 is presented in FIG. 3A, which is similar to the unfolding stage 160 (FIG. 1). The configuration 301 includes a load 365, for example, a capacitor or an actuator, and switches Q3, Q4, Q5, and Q6. This configuration enables doubling the effective output voltage signal on the load 365, that translates for an actuator as approximately 2 times more displacement. The full-bridge may be referenced to the input voltage to be used with a power converter such as a 2-switch buck-boost (FIG. 2A). FIG. 3B shows a full-bridge output 302 with discrete voltage reference choice. FIG. 3C shows a full-bridge output stage 303 with analog variable reference $V_{ref}$. FIG. 3D shows an output stage 304 with the load 365 connected to a discrete variable reference, whereas FIG. 3E shows an output stage 305 with the load 365 connected to a variable analog reference $V_{ref}$.

If the first stage is a 2-switch flyback configuration 223 (FIG. 2C), 224 (FIG. 2D), the full-bridge may be referenced to GND, as shown by the converter 303 of FIG. 3B. In other cases, a full-bridge converter 304 with discrete variable reference (FIG. 3C), enables higher power delivery efficiency. Note that while depicted with two alternative reference points (GND and $V_{in}$ on FIG. 3B), the illustrated concepts may be expanded to an arbitrary number of discrete reference points. In a very low distortion application, a full-bridge with variable analog reference may reduce distortion and improve converter stage efficiency. If a unipolar output is desired, the same approach may be used with the same advantages as shown in FIGS. 3D and 3E. For the converter output stage 303 shown in FIG. 3C and the output stage 305 shown in FIG. 3E, the triangle symbol represents an amplifier to which one may feed a variable input $V_{ref}$ and control that side of the load 365.

Combining the circuits of FIGS. 3B and 3C or FIGS. 3D and 3E provides for smoothing out the transition between the particular reference voltages while enabling higher power efficiency because the variable analog reference, which is less efficient than a simple switch, may be active only during the transition. Such combinations may provide the lower distortion advantage of the analog reference while retaining most of the power advantage of the discrete reference approach.

Under the above described embodiments, the folded waveform is depicted as a "half" waveform (sine wave) and that is unfolded into a full waveform by an unfolding output stage 160. However, in some scenarios a better approach is directly applying the circuit of FIG. 2A with no output stage from FIGS. 3A-3E, where the driver generates the full waveform. Therefore, while there may be scenarios where the folded waveform may be a half waveform, the embodiments are not intended to be limited to generating a folded (half) waveform.

Figure 4:
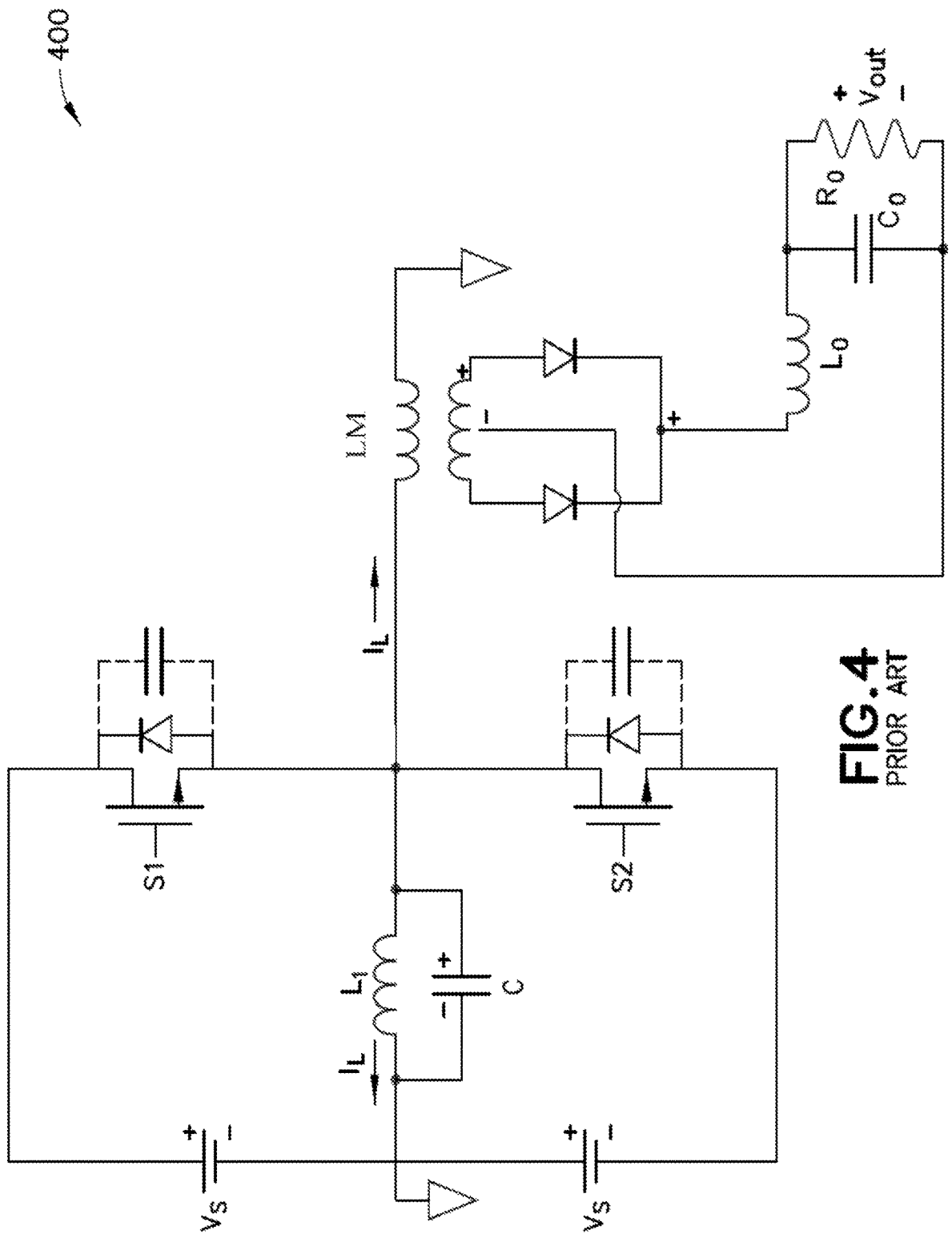
FIG. 4 is a circuit diagram illustrating a prior art pseudo-resonant operation of a power converter.

FIG. 4 shows a pseudo-resonant operation of a power converter 400 that was first proposed in 1991 to reduce switching losses in high frequency converters. The design is based on knowledge of the fixed input and output condition and the inclusion of a resonant network composed of an inductor and capacitor.

Figure 5:
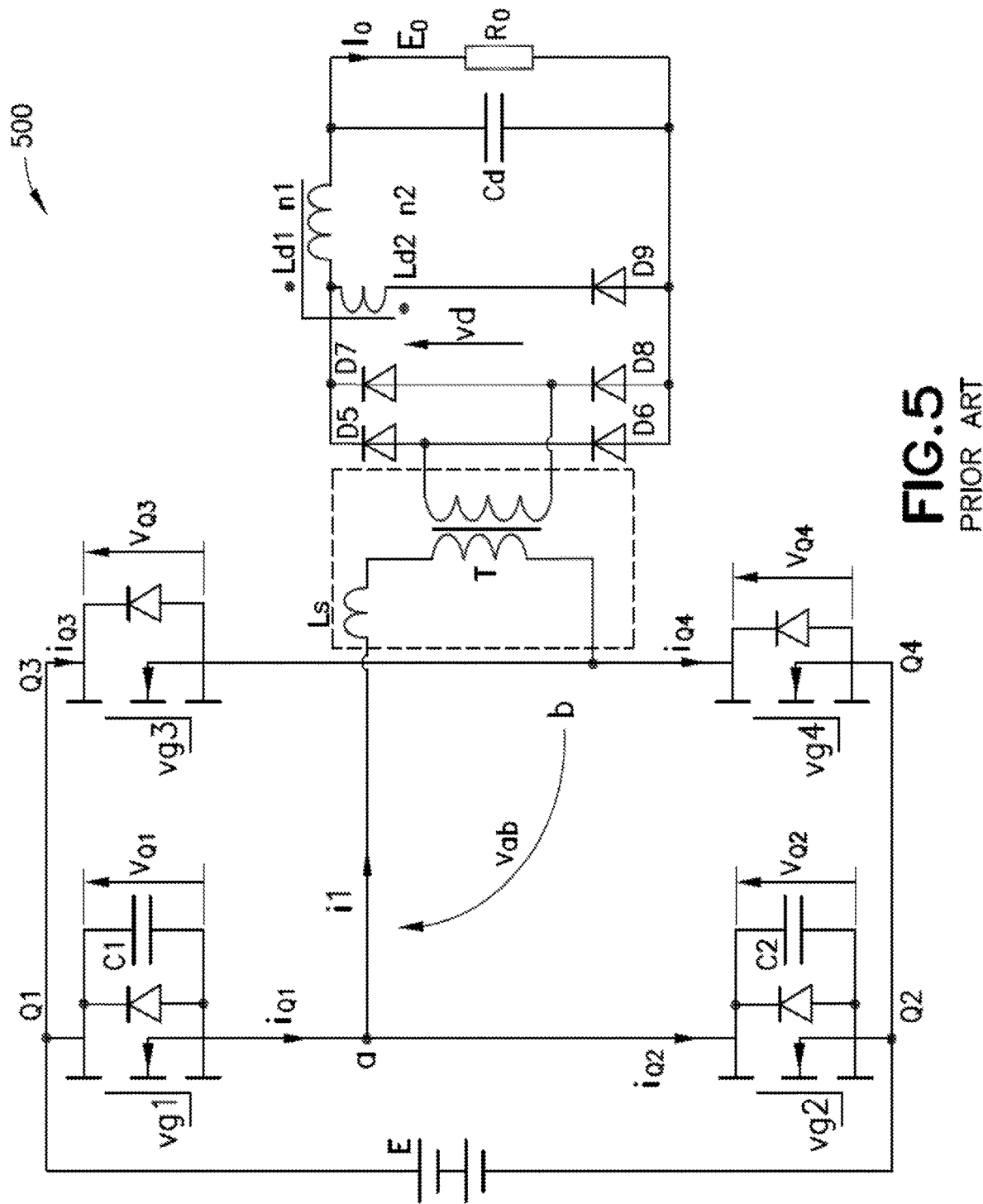
FIG. 5 is a circuit diagram illustrating a more recent prior art pseudo-resonant operation of a power converter using similar principals to the circuit of FIG. 4.
Figure 7:
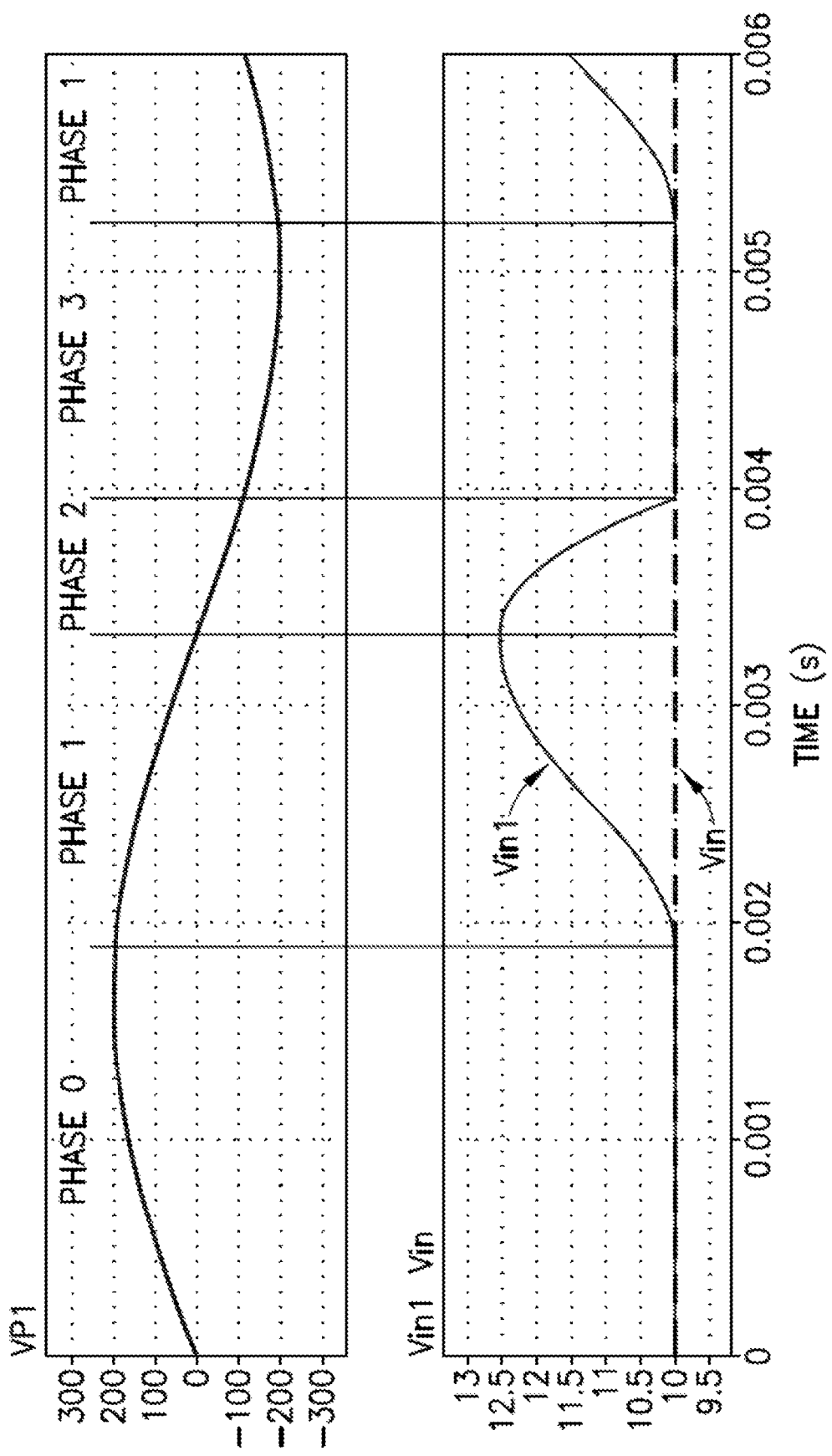
FIG. 7 shows two voltage plots illustrating the effect of supplying a bi-directional converter with a unidirectional power input.

FIG. 5 shows an implementation of a circuit 500 using similar principals to the circuit of FIG. 4. Here again, the implementation includes passive components to achieve the benefit. High voltage capacitors C1 and C2 are included in the circuit thus increasing cost and size of the solution. Moreover, this implementation is a DC/DC converter so the input/output voltage relationship is static, thus simplifying the problem.

Compared with previous circuits, for example, as shown by FIG. 19, the first embodiment 100 (FIG. 1) may operate in pseudo-resonant mode without adding any dedicated reactive (inductive (L) or capacitive (C)) components. This provides the benefit of pseudo-resonant operation without use of additional components. The pseudo-resonant operation constantly monitors the output voltage. The output voltage is used to compute the current required in a first low-side switch Q1 pulse to achieve pseudo-resonant charging of the switching node up to the output voltage. Moreover, because the output/input relationship is constantly changing, the controller dynamically adapts the current required in Q1 at each switching cycle to the present operating conditions. Since at some point, the converter needs to process levels of power that are below its capability, the pseudo-resonant implementation recognizes discontinuous conduction mode (DCM) and turns off Q1 in zero current switching (ZCS) mode to finish the synchronous switching cycle, without losing extra energy in the circuit. When the converter is in DCM and a new pulse is required to transfer energy, the circuit resumes first by turning on Q1 to generate a pseudo-resonant pulse and avoid high switching losses from hard switching a second switch Q2.

Although bi-directional operation of a power converter is used in many applications, single die bi-directional converters are not practical in standard CMOS technology due to parasitic transistors formed when current is flowing in the reverse direction. To solve that issue, the first embodiment driver 100 may be implemented using a Silicon on Insulator (SOI) technology. This enables the driver to have all its switches Q1-Q6 implemented on a single die which reduces size and cost of the solution.

A bi-directional converter transfers power in two directions: input to output, and output to input. When the bi-directional converter is used to drive a capacitive load, it can be assumed that the net flow of energy over a waveform period (where output starts and finishes at the same voltage level) may be from the input to the output due to the law of energy conservation. Losses in the system make it inevitable that more energy enters the system than exits the system. Also, in power converters, the general case is that the closer the voltage conversion ratio is to unity, the higher the conversion efficiency may be due to lower losses.

Providing a unidirectional power input to a bi-directional converter causes the following to happen. First, power is drawn from the input source when the power converter is in forward mode (input to output). Second, energy recovered accumulates on the input energy storage device, for instance a capacitor, when in reverse mode (output to input).

Energy accumulation on a capacitor causes input voltage to increase, thus lowering the voltage conversion ratio and leading to higher overall power efficiency. This is illustrated by voltage plots in FIG. 7. $V_{P1}$ (top graph) is the differential voltage across a load, $V_{in}$ (bottom graph) is the input voltage of the system, and $V_{in}1$ is the voltage at the input of the bi-directional converter. In phase 0, $V_{in}1$ sits at the same value as $V_{in}$ when the converter operates in forward mode for the first time. In phase 1, the converter changes to reverse mode. The energy recovered accumulates on the bi-directional converter input energy storage device. Consequently, $V_{in}$ increases. When the converter changes back to the forward mode in phase 2, it starts by consuming the energy accumulated on C1 (no current flows from $V_{in}$ in this phase). When $V_{in}$ reaches $V_{in}$, the converter starts to use energy from $V_{in}$ again (Phase 3). Phases 1, 2, and 3 repeat themselves as long as the converter operates. Power savings are realized in two ways. First, during phases 2 and 3 the voltage conversion ratio is reduced yielding higher efficiency. Second, the RMS current ($I_{rms}$) flowing to/from $V_{in}$ is reduced thus DC losses ($\propto I_{rms}^2 R$) where R is the parasitic resistance of the current path from the system power source, for instance a battery, to $V_{in}$. Another benefit of unidirectional power input is that it allows to safely connect a bi-directional converter in any systems. For instance, energy recovery from the driver load creates a reversed current flow in the system power delivery network. This reverse current flow can present a safety hazard if the power source is a battery or a functional hazard if the system was designed assuming all loads would be resistive (where current flows only in one direction). The exact voltage increase can be adjusted by first calculating the maximum energy that may be recovered from the load and then sizing the input capacitor (C1) appropriately to achieve the desired voltage increase.

FIGS. 7A-7D illustrate four alternative embodiments of the unidirectional power input. The simplest implementation is a diode D1 as shown in FIG. 6A, having a power source, the diode D1, a capacitor C1, a bi-directional power converter 705, and a load 765. FIG. 6B presents an implementation 720 where losses in the input may be lowered by using an active switch 721 in place of the diode D1. If the switch 721 has the ability to allow current in both directions, then the reverse conduction capability may be used to also recover the energy stored in the capacitor C1 when the converter prepares to shut down. FIG. 6C shows that, more generally, any power converter, for example, a unidirectional power converter 735, may be used. The potential advantage of including a unidirectional power converter 735 is that it can increase the base value of $V_{in}1$ above $V_{in}$. That voltage increase enables the main power converter to operate with a lower voltage conversion ratio, thus leading to a better overall efficiency. Charge pumps and inductor based converters are examples of possible power input stages. The optimal implementation depends on the application. Similar to FIG. 6B, FIG. 6D presents the use of a bi-directional converter 745 for the input. While the driver of FIG. 6D has bi-directional capability, its reverse power transfer capability may only be used when the main converter is about to shut down to recover the energy available on the capacitor C1. The reverse power capability can also be used in case of an overvoltage situation is detected on the capacitor C1 to prevent circuit failure.

In a typical step-up converter, the output device for example switch Q2 (FIG. 1) is preferably a discrete part or on a different die to avoid triggering parasitic transistors in standard CMOS processes. Triggering of these parasitic devices significantly reduces the amount of energy transferred from the input to the output because a significant amount of the energy is connected to the substrate through these parasitic paths. Presently, integrating a single forward diode in the converter is unconventional and a highlighted feature in data sheets.

In the topology of FIG. 1, there may be up to five problematic devices, in particular Q2, which acts as the output diode in any boost converter arrangement, but also Q3-Q6 when the converter transfers energy from the output to the input. To solve this issue, the first embodiment may employ a Silicon on Insulator CMOS technology. That technology removes the parasitic devices, thus enabling the full integration or nearly full integration of the driver.

The use of a full-bridge (Q3, Q4, Q5, Q6) for a low-cost highly integrated IC may be a problem as the four switches are not referenced to GND which increases the area, size and power required to control them. In response, SOI technology capabilities may be leveraged. FIG. 4 shows a low-voltage supply that sits on top of the $V_{in}$ voltage level. By using a charge pump, an output voltage of twice the input voltage may be produced. However, twice the input voltage puts excessive voltage stress on the transistor. To solve the problem, a full-bridge driver is referenced to $V_{in}$ instead of gnd. Consequently, the voltage across the full-bridge driver devices becomes $V_{in}$, the normal operating voltage.

Figure 9:
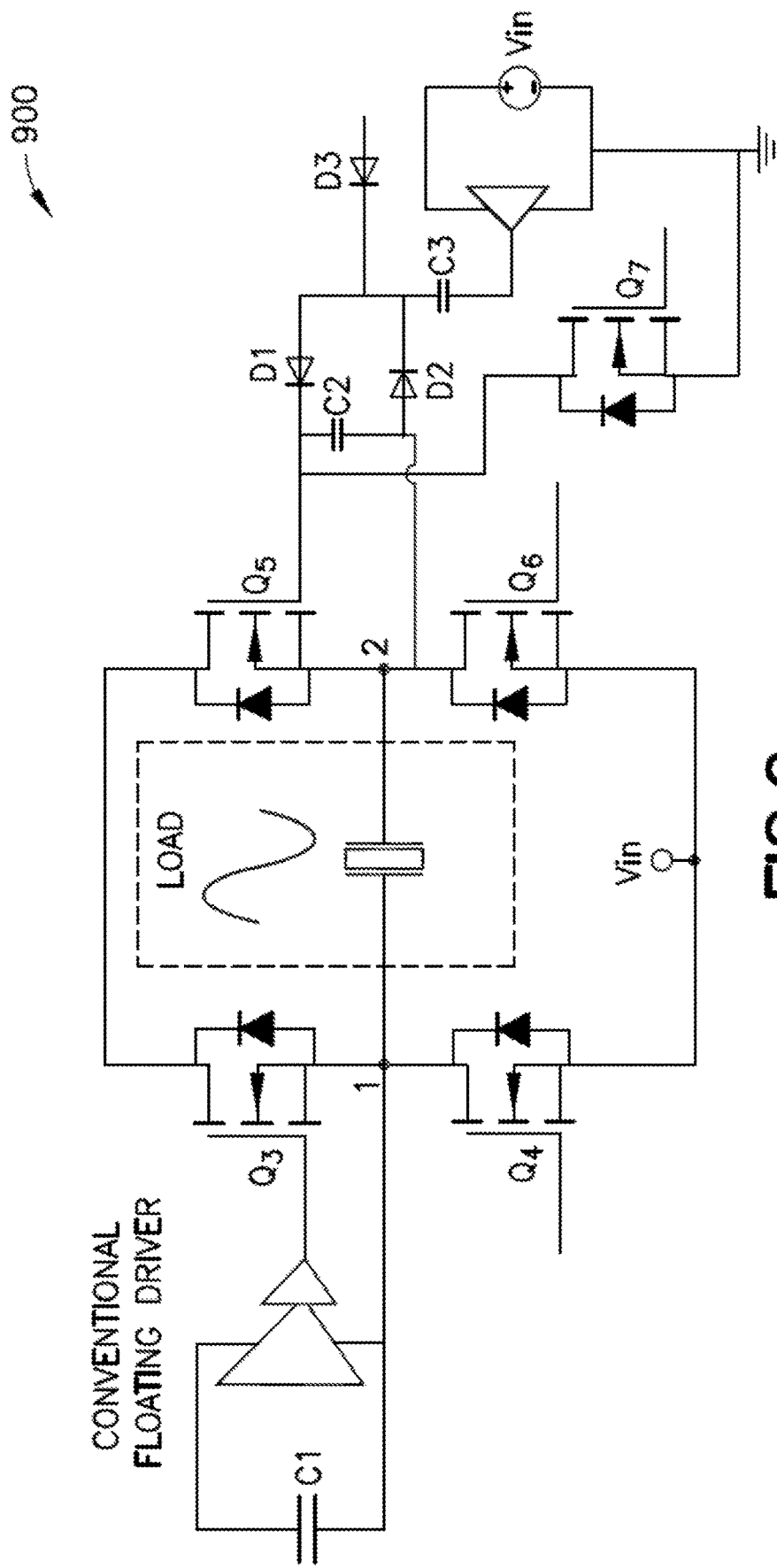
FIG. 9 is a circuit diagram of a driver circuit embodiment having a common high-side gate driver vs a new driver.

The circuit 800 of FIG. 8 only solves the problem to drive Q4 and Q6 which are referenced to Vin. For Q3 and Q5 a different circuit may be used. A common implementation 900 is shown in FIG. 9 driving Q3. Here, driving Q3 uses a very large capacitor, for example, 10s nF C1 to store enough energy to be able to supply the driver controlling Q3 while the source voltage of Q3 is high. Once the source voltage of Q3 goes low again, the capacitor C1 can be recharged in preparation for the next cycle. That approach may not work for a highly integrated solution as C1 may not be integrated on chip due to its high capacitance. Also, that approach needs the designer to guarantee a certain refresh rate of C1 to be able to ensure that the driver works properly. That means a high voltage cannot be held for long.

The circuit 900 of FIG. 9 addresses these problems. When node 2 is low (=$V_{in}$), Q5 gate may be activated by charging C2 through D3. D3 is connected to the gate of Q4. This charging path is not essential, but enables Q5 to turn on faster. Then when node 2 starts to go higher, charges on C2 may be refreshed to counteract the current associated to the parasitic capacitance of Q5 and leakage paths. To do so, the combination of D1, D2 and C3 acts as a charge pump keeping the gate of Q5 approximately Vin V higher than its source. To turn off Q5, switch Q7 is turned on. All the components depicted here may be very small because very little charge needs to be replaced on C2. For example, capacitors are in the pF range and the diodes are very small since very little power is needed. Also, this arrangement makes it possible to process arbitrary waveforms without imposing any refresh rate constraint for the user. This full-bridge driver, makes possible the integration of a full-bridge on die with very little driver area overhead.

Figure 11:
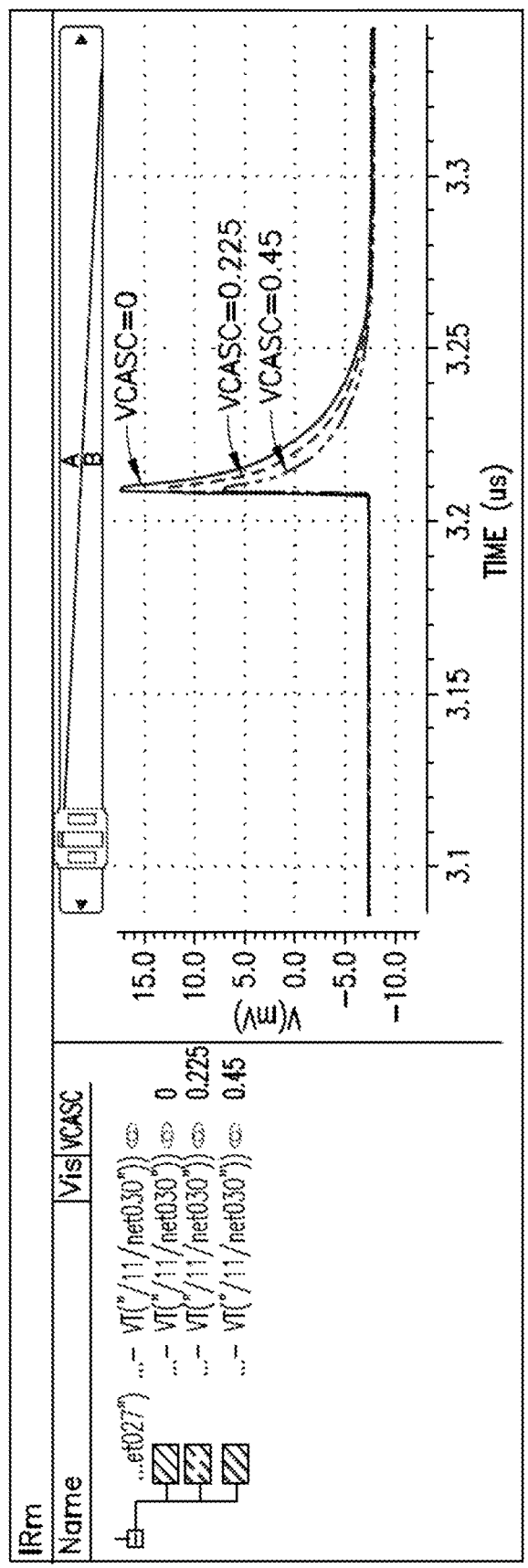
FIG. 11 is a plot showing the effect of decreasing the voltage difference between the DAC output and alternated path.

Typically, current digital to analog converters (DAC) have an alternate current path connected to the supply voltage, as per the circuit 1010 of FIG. 10A. However, when the DAC value changes, the parasitic capacitance of each bit line takes longer to settle due to the large variation in voltage between node 1 and node 2. To improve that, both current paths are connected through a pair of cascade devices biased at the appropriate voltage Vbias, as shown by the circuit 1020 of FIG. 10B. This reduces the time between a change of DAC value and the time the output of the DAC settles to the new value. FIG. 11 shows simulated results. The Vcasc=0.45 result is when the alternate current path is connected to a voltage source at a voltage level similar to the output.

FIG. 11 represents the effect of decreasing the voltage difference between the DAC output and alternated path. When difference is smaller transient voltage is smaller and settling is faster. Under the present embodiments this enables the circuit to use a smaller blanking time for current detection. As used herein, "blanking time" refers to the finite amount of time before the reference settles to the desired value when a change in the current value is detected. During the blanking time, the sensor output may be deactivated to avoid false triggering. On a higher level, this enables more accurate current detection and lower output distortion of the final waveform.

In general, current control may be achieved through a series resistor with an inductor, a parallel RC circuit or senseFet in parallel to each switch. In such a driver, high precision current sensing is desirable to operate in a synchronous mode, as switches should be turned off at absolute zero current (as opposed to peak current detection that may be automatically corrected by the controller). Use of a parallel RC circuit is not an option because the circuit operates in DCM. The senseFet approach may work for the low side switch (Q1). However, implementing a highly accurate senseFet for the switch Q2 is difficult due to the large voltage swings of Q2. Also, to avoid having to create a high side ZVS detection circuit for Q2 ZVS, a series resistance provides good current sensing ability even when both switches are off. That enables detecting the ideal point to turn on Q2 without an additional circuit.

The current sense circuit used in the present embodiments preferably detects up to 3 different events per switching cycle to enable high efficiency of the converter. Regrouping all those events in a single sensor provides for higher sensor power for higher performance, since it replaces three sensors.

Due to wide varying conditions in the converter, the relatively fixed latency of the current sensing circuit means that different offset between the desired switching point and real switching point may occur, which is significant because if the synchronous rectifier turns off at −30 mA instead of 0 mA, the efficiency may be much lower. Accordingly, the controller may calculate a different offset for the current sensing circuit according to the instantaneous conditions, allowing the switch to activate at the correct time.

Figure 12:
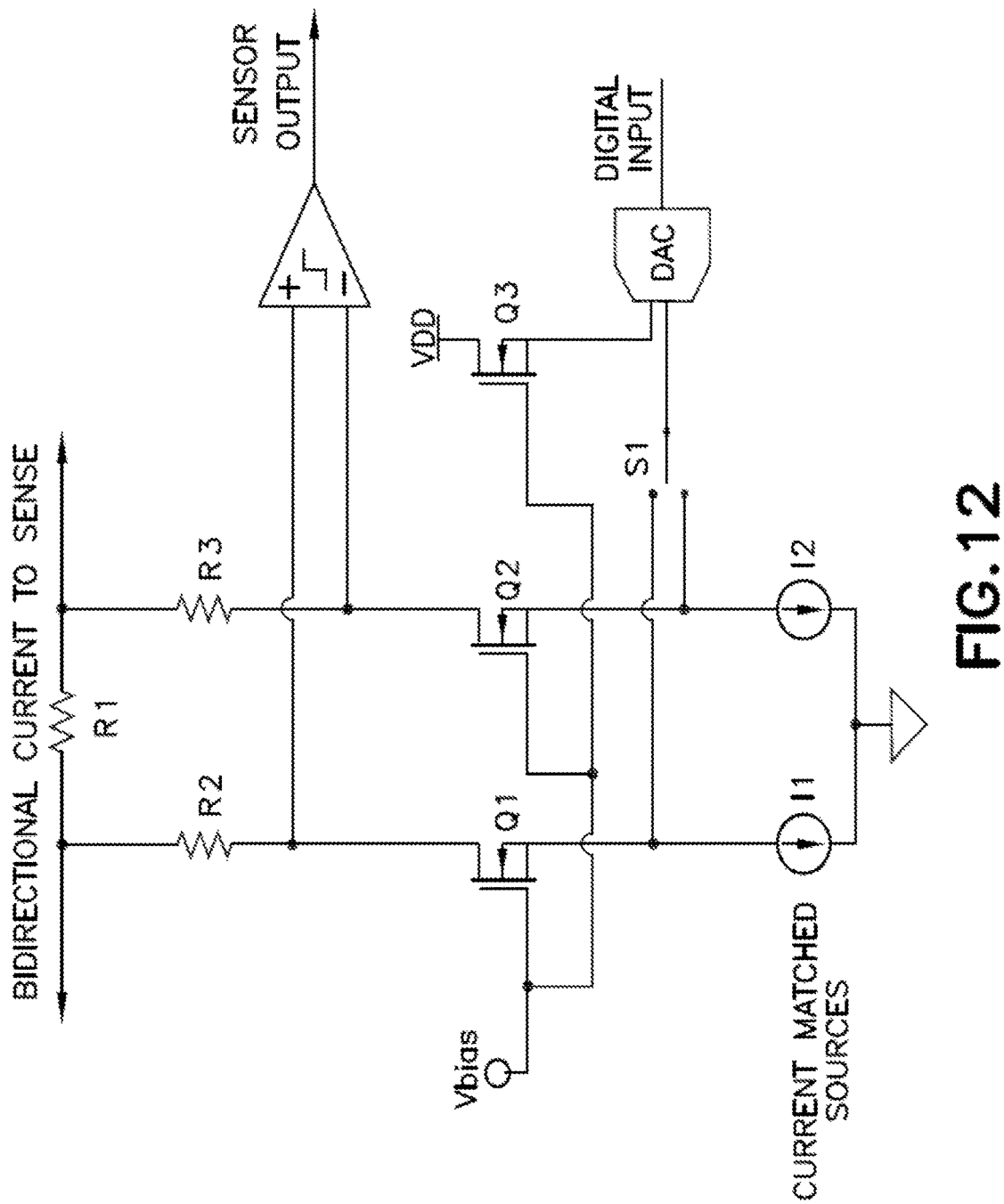
FIG. 12 is a circuit diagram of an exemplary single sensor bi-directional current sensing circuit with the DAC from FIG. 10B.

The combination of the enhanced current DAC previously described with a bi-directional sense scheme allows the reuse of the same DAC and comparator to sense current in both directions. It also enables a one bit increase in the effective DAC resolution at very low area costs. For example, if the DAC is a nine bit DAC, this configuration allows sensing of current from −511 to 511 mA, instead of a range from 0 to 511 in conventional connections. An embodiment of such a circuit is shown in FIG. 12. The sensed target current flows through S1. Depending on S1 configuration, the value of the current is interpreted as a positive or negative value by the circuit. Q1, Q2, and Q3 form the enhanced current DAC described below. The two current sources I1 and I2 are matched (same current) and bias the two inputs of the comparator at the same voltage if the DAC current is 0 and current sensed is also 0. R2 and R3 are matched resistors providing a DC offset to allow bi-directional sensing and also ease the comparator operation.

When current flows through R1, the voltage at the inputs of the comparator changes according to I*R1. Changing the DAC value changes the current required in R1 so that the two inputs of the comparator may return to the same voltage level. Then the comparator fires to indicate that the desired current threshold has been reached.

While transistors are used in the current implementation for power switches, MEMS switches could be used in the future to lower the power path resistance and ease the control of high-side switches. An example of MEMS switches is manufactured by General Electric (2015).

Low distortion is an important performance criterion for piezoelectric actuator drivers. While the power stage design and resolution of the feedback path constrain the distortion level, the control algorithm ensures that the complete solution achieves a superior scenario instead of a higher distortion level. While a fixed PI controller would be adequate because of the wide varying operating conditions, the controller parameters would need to be set to the most conservative setting to ensure stability in all cases. However, this does not adequately reduce distortion. Leveraging the flexibility of a digital controller, the controller designed for drivers under the current embodiment adapts its proportional and integral gain to the instantaneous operating conditions (output/input voltage, frequency), resulting in up to 20 dB improvement of the distortion.

Automatic offset adjustment of the current DAC enables accurate Zero Current Switching at all times. Because the power converter state varies considerably, a fixed latency through the controller does not always produce the same results in terms of switching time accuracy. In one case, trying to turn-off a switch at 0 mA might turn it off at −2 mA while in another set of condition, it can result to a turn-off at −30 mA. That uncertainty creates problems for the controller both in terms of power loss and also quality of the output (distortion). To solve the problem, the controller automatically corrects the target current to an "artificial current target." When the current sensor triggers at that artificial value, the controller turns on/off the intended switch. Because the correction function (f(converter state)) knows the system, the switch that triggered at the "artificial current target" beneficially turns on/off at the intended target current value. Importantly, this enables the ability to turn on the High Side switch (Q2) at the right time to achieve zero voltage switching, leading to lower power, but perhaps more importantly, lower distortion.

A controller 1300 for controlling the driver, for example, a digital controller, may be a computer, an example of which is shown in the schematic diagram of FIG. 13. The controller 1300 contains a processor 1302, a storage device 1304, a memory 1306 having software 1308 stored therein that defines the abovementioned functionality, input and output (I/O) devices 1310 (or peripherals), and a local bus, or local interface 1312 allowing for communication within the controller. The local interface 1312 can be, for example but not limited to, one or more buses or other wired or wireless connections, as is known in the art. The local interface 1312 may have additional elements, which are omitted for simplicity, such as controllers, buffers (caches), drivers, repeaters, and receivers, to enable communications. Further, the local interface 1312 may include address, control, and/or data connections to enable appropriate communications among the aforementioned components.

The processor 1302 is a hardware device for executing software, particularly that stored in the memory 1306. The processor 1302 can be any custom made or commercially available single core or multi-core processor, a central processing unit (CPU), an auxiliary processor among several processors associated with the present controller 1300, a semiconductor based microprocessor (in the form of a microchip or chip set), a macroprocessor, or generally any device for executing software instructions.

The memory 1306 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 1306 may incorporate electronic, magnetic, optical, and/or other types of storage media. Note that the memory 1306 can have a distributed architecture, where various components are situated remotely from one another, but can be accessed by the processor 1302.

The software 1308 defines functionality performed by the controller 1300, in accordance with the present invention. The software 1308 in the memory 1306 may include one or more separate programs, each of which contains an ordered listing of executable instructions for implementing logical functions of the controller 1300, as described below. The memory 1306 may contain an operating system (O/S) 1320. The operating system essentially controls the execution of programs within the controller 1300 and provides scheduling, input-output control, file and data management, memory management, and communication control and related services.

The I/O devices 1310 may include input devices, for example but not limited to, a keyboard, mouse, scanner, microphone, etc. Furthermore, the I/O devices 1310 may also include output devices, for example but not limited to, a printer, display, etc. Finally, the I/O devices 1310 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the controller is in operation, the processor 1302 is configured to execute the software 1308 stored within the memory 1306, to communicate data to and from the memory 1306, and to generally control operations of the controller pursuant to the software 1308, as explained above.

When the functionality of the controller is in operation, the processor 1302 is configured to execute the software 1308 stored within the memory 1306, to communicate data to and from the memory 1306, and to generally control operations of the controller pursuant to the software 1308. The operating system 1320 is read by the processor 1302, perhaps buffered within the processor 1302, and then executed.

When the controller is implemented in software 1308, it should be noted that instructions for implementing the controller can be stored on any computer-readable medium for use by or in connection with any computer-related device, system, or method. Such a computer-readable medium may, in some embodiments, correspond to either or both the memory 1306 or the storage device 1304. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 1302 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the controller is implemented in hardware, the controller can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As used within this disclosure, a proportional-integral-derivative controller (PID controller) describes a control loop feedback mechanism (controller). A PID controller continuously calculates an error as the difference between a desired setpoint and a measured process variable. The controller attempts to minimize the error over time by adjustment of a control variable, such as the position of an actuator, to a new value determined by a weighted sum. The proportional response may be adjusted by multiplying the error by a constant proportional gain (Kp).

Figure 14A:
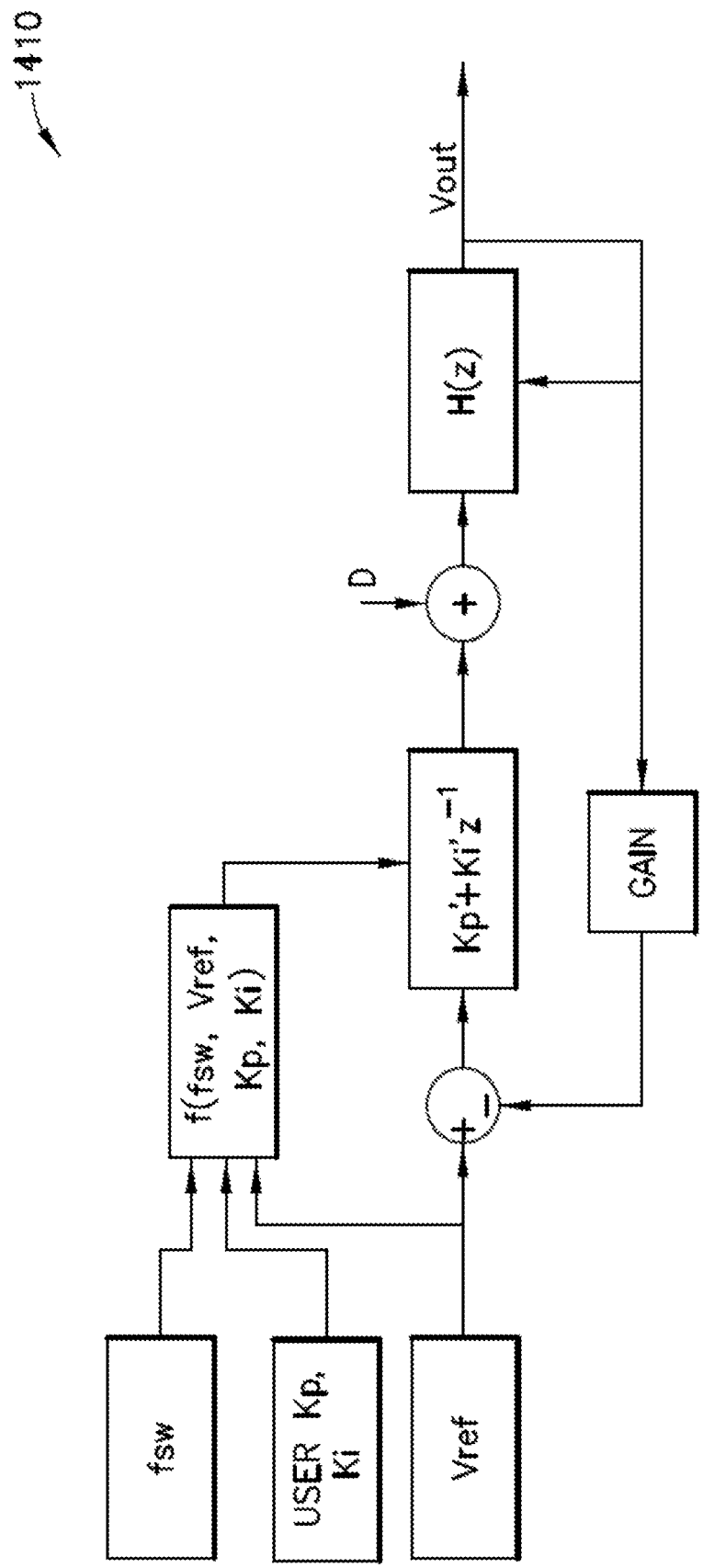
FIG. 14A is a schematic block diagram of an exemplary embodiment for a driver controller.
Figure 14B:
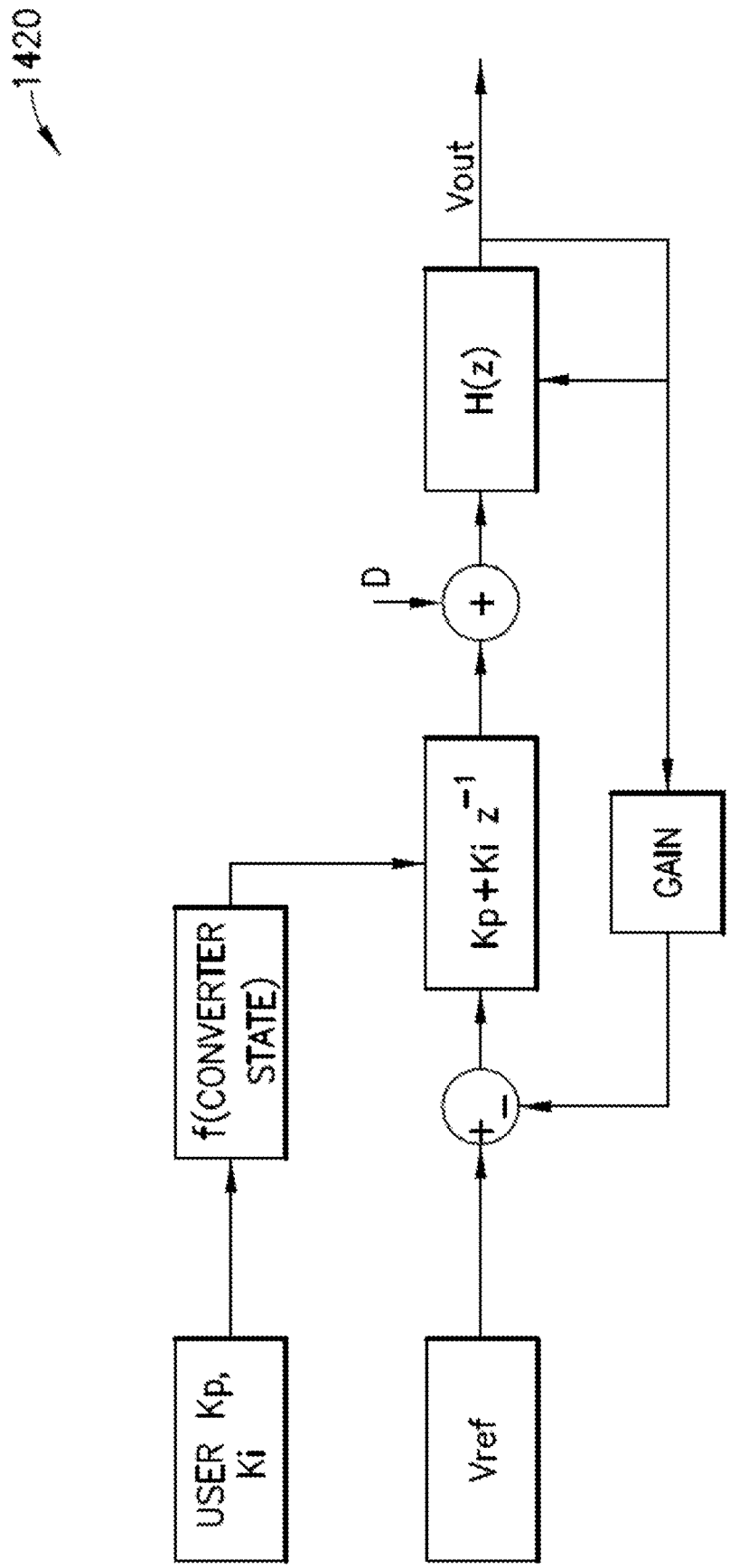
FIG. 14B is a schematic diagram of an exemplary control configuration.

FIGS. 14A and 14B are two block diagrams of exemplary embodiments 1410, 1420 of control drivers, providing compact, low-power, low-noise piezoelectric cooling. In these embodiments the controllers 1410, 1420 use information available through different state variables inside the digital controller on the current state of the driver to adapt the proportional gain Kp and an integral gain (Ki) of the controller. As a result, the waveform distortion is reduced. FIG. 14A is more specific. FIG. 14B is more general to illustrate how the scaling of Kp and Ki according to a function of the driver state variables enhances the system performance. FIGS. 14A and 14B, indicate the converter switching frequency (fsw), the voltage reference to track (Vref), the proportional gain (Kp), the integral gain (Ki), the converter transfer function (H(z)), an external disturbance (D), feedback gain (Gain), and output voltage of the converter (Vout). In the simplest embodiment, Kp may be scaled linearly with the output voltage (Kp'∝Vout×Kp) and Ki may be scaled linearly with the switching frequency (fsw) (Ki'∝fsw×Ki). D represents any disturbance that could exist in a practical implementation. H(z) represents the transfer function of the system in a discrete-time representation. $z^{-1}$ is an operator associated with the z-transform commonly used in controllers using discrete-time representation. In the exemplary embodiment, fsw is in the range between 150 kHz and 1 MHz.

Figure 15:
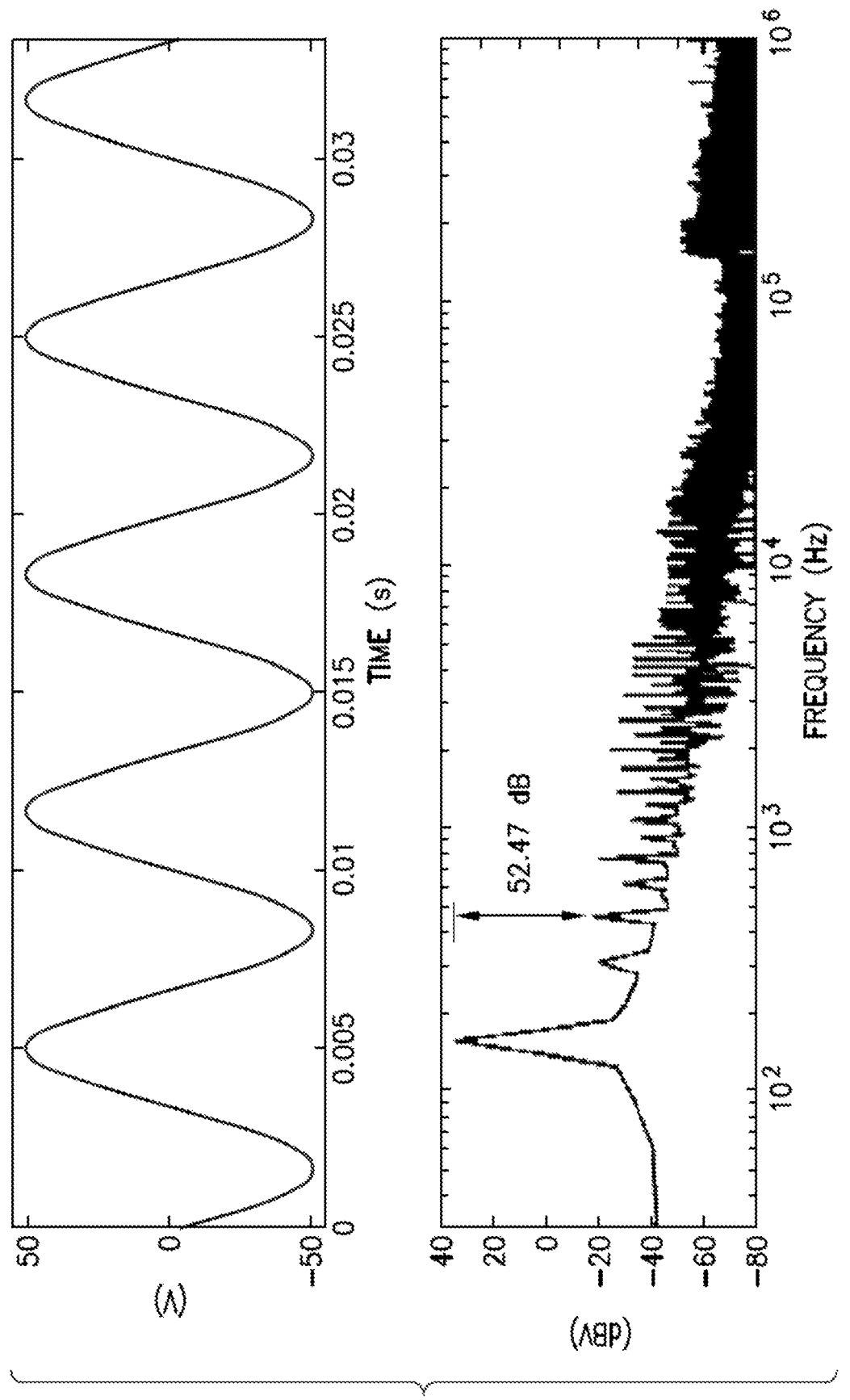
FIG. 15 is a plot of the output of the exemplary driver for a measured 101.8 Vpp, 150 Hz waveform in a 150 nF capacitive load and a plot of its spectrum having a 0.38% THD+N in a 1 MHz bandwidth.
Figure 16:
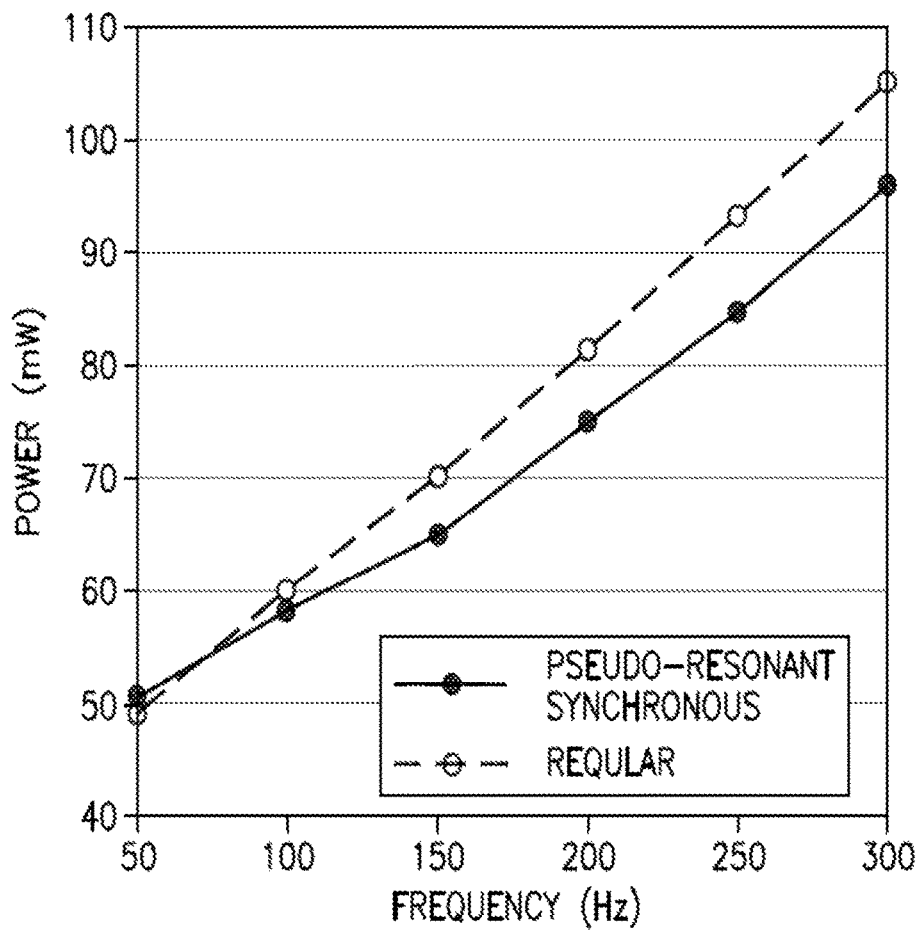
FIG. 16 is a plot demonstrating how a pseudo-resonant synchronous buck operation saves up to 8.9% power vs regular buck operation for a 100 Vpp output in a 150 nF capacitor from a 5 V input.
Figure 17:
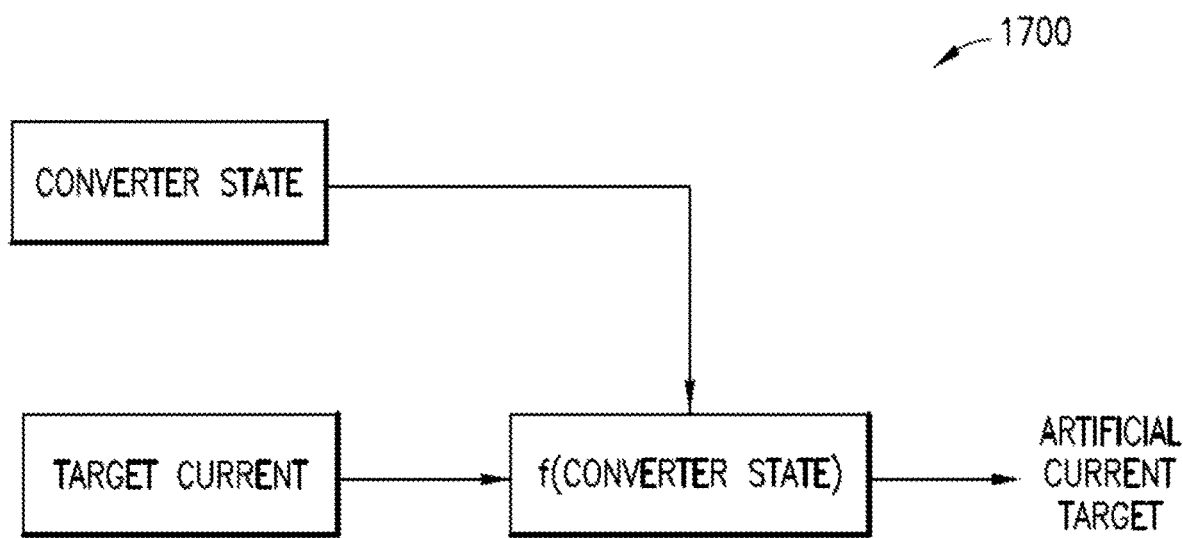
FIG. 17 is a schematic diagram of a real-time adjustment of the current target to achieve precise turn-on/turn-off behavior.

FIGS. 15 and 16 illustrate results using the prototype of FIG. 11. FIG. 15 presents a 150 Hz, 101.8 Vpp sinusoid in a 150 nF capacitive load generated with the prototype from a 3.6 V supply. Even without a magnetic output filter, the prototype achieves a THD+N of 0.38% in a 1 MHz bandwidth. The spectrum shows the switching noise of the converter in the hundreds of kHz range does not significantly degrade the waveform. At that operating point, the prototype consumes 64.04 mW, 40.00 mW from the power path and 24.04 mW from the controller excluding the FPGA. This result is 7.81 to 13.85 times lower than prior single-inductor solutions providing high-voltage low-distortion outputs. The pseudo-resonant synchronous buck mode achieves up to 8.9% reduction in power compared to regular buck mode as seen in FIG. 16.

It will be apparent to those skilled in the art that various modifications and variations can be made to the structure of the present invention without departing from the scope or spirit of the invention. For example, the exemplary drivers may be used other types of piezoelectric actuators than a DCJ, for example, a haptic feedback actuator, or a micro robotics actuator. More generally, the exemplary drivers may be advantageous when used with any capacitive load that requires a high voltage/low distortion waveform, such as an electrostatic actuator like a micro-mirror, an electro-mechanical polymer, an electro-active polymer, or another type of MEMS device.

In addition to the benefits of the embodiments described above, another important benefit is to make the circuit compatible with a wide range of energy sources. For example, if connecting a bi-directional power converter to a certain type of battery as input energy source, with previous converters the battery might not be able to sink current (e.g. non-rechargeable batteries) or need to sink current in a very controlled way to avoid potential failures (e.g. Li-Ion). The unidirectional power addresses this problem, for example, during system integration.

The above description has provided exemplary embodiments of a high voltage capacitive actuator. The following describes exemplary embodiments of a highly integrated piezoelectric actuator driver. Preferably under this embodiment the input is in the 3V-5V range having an output of on the order 10 s to 100 s of Vpp (peak to peak), for example, prototypes with 100 Vpp and 200 Vpp output range have been built. The output range may be scaled according to the needs of a particular application. The actuator driver may have a low power input, for example, below 100 mW, with output waveform total harmonic distortion and noise (THD+N) below 0.50%. The output bandwidth is up to 300 Hz at the maximum capacitive load, for example 330 nF, and maximum output voltage, for example 100 Vpp. The same device can accommodate different combinations of output bandwidth, capacitive load and output voltage. For instance, the maximum average output power may be computed by $$P = fCV_{pk}^2 \qquad \text{(Eq. 2)}$$

where f is the frequency of the output waveform, C represents the capacitive load and $V_{pk}$ represents the peak amplitude of the waveform. For alternative embodiments, any combination of f, C and $V_{pk}$ may be possible as long as the resulting P is below the maximum P of the embodiment, Vpk is equal or below the breakdown voltage of the power devices used and f is below the maximum feedback bandwidth and or switching frequency of the embodiments. In some exemplary embodiments, the maximum feedback bandwidth may be at 500 kHz and the maximum switching frequency in the range of several hundred kHz, so the practical maximum frequency goes up in the range of 50 kHz. The embodiments may be implemented in a small (PCB and die), single inductor, highly integrated low-power topology. The embodiments have an input stage that feeds a high frequency bidirectional power converter producing a folded waveform received by a full-bridge low loss switch network, which unfolds the waveform to drive a capacitive load.

As noted in the Background section, piezoelectric actuators are used in a growing range of applications, e.g., haptic feedback systems, cooling fans, audio, and microrobots. However, to fully realize their potential, these actuators require drivers able to efficiently generate high-voltage (relative to the input, for example 20 Vpp and up to 100 Vpp and above), and, in some applications, low frequency (below 300 Hz) analog waveforms from a low-voltage source (3-to-5V) with small form factor. Certain applications, such as piezoelectric (PZT) cooling fans, further demand low distortion waveforms (THD+N<1%) to minimize sound emission from the actuator. Existing solutions for small PZT drivers typically implement a power converter to step up a low voltage followed by a high-voltage amplifier. Although envelope tracking can help reduce amplifier power, none of these designs can recover the energy stored on the actuator to improve efficiency. And while a differential bidirectional flyback converter can recover energy, it uses four inductors, thereby incurring a significant size penalty.

As used herein, high-voltage is generally a relative term, indicating a voltage range higher than the input voltage $V_{IN}$, for example twice the input voltage, or an order of magnitude higher (or more) than the input voltage.

As noted above, while the present embodiment is described for low frequency applications (below 300 Hz), the invention is not limited to low frequencies, and alternative embodiments may be adapted for higher bandwidth applications, for example, audio drivers (0-20 KHz), among others.

The exemplary embodiment includes a single-inductor, highly integrated, bidirectional, high-voltage actuator driver that achieves 12.6×lower power and 2.1×lower THD+N at a size smaller than the previous state-of-the art solution. Measured results have demonstrated 200 Hz sinusoidal waveforms up to 100 Vpp with 0.42% THD+N from a 3.6V source while dissipating 57.7 mW to drive a 150 nF capacitor. Beyond PZT actuators, the IC can also drive any type of capacitive load, for example, electrostatic and electroactive polymer actuators.

Figure 20:
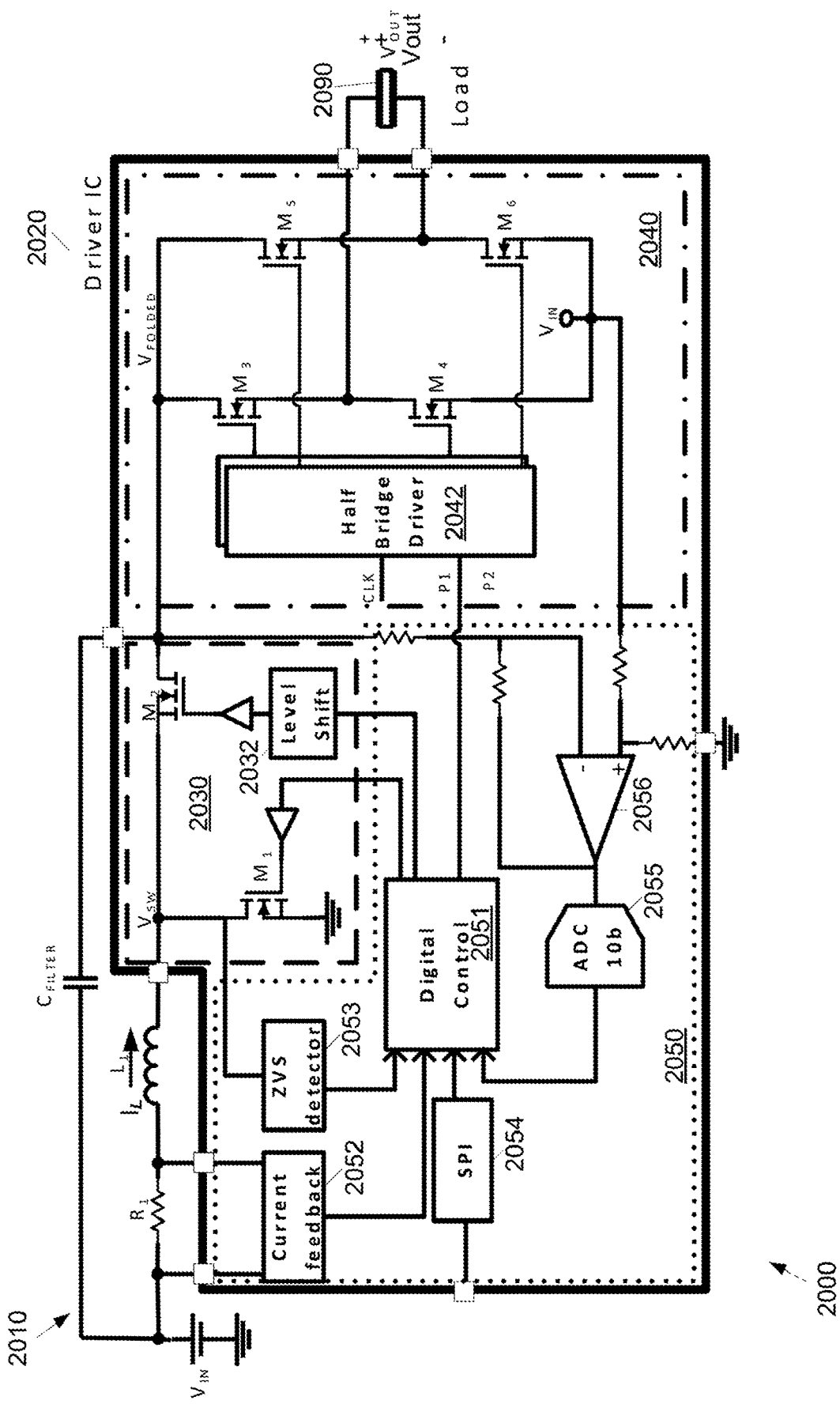
FIG. 20 is a schematic drawing of a single die embodiment of a highly integrated piezoelectric actuator driver.

As shown by FIG. 20, the exemplary driver includes a driver integrated circuit (IC) 2020 driving a load 2090 across an output voltage $V_{OUT}$, and an input portion 2010 where an input voltage $V_{IN}$ feeds one external inductor $L_1$ (external to the driver IC 2020), one filter capacitor $C_{FILTER}$ and a sense resistor $R_1$. The filter capacitor $C_{FILTER}$ may be, for example, in the range of 5% of the capacitance of the load (e.g. 10 nF for a 150 nF load), and may serve to filter high-frequency switching noise. The driver IC 2020 includes three main blocks 2030, 2040, 2050. A bidirectional synchronous power converter stage 2030 shown within dashed lines generates a folded waveform ($V_{FOLDED}$) from the low-voltage input voltage source ($V_{IN}$) by transferring small increments of energy to the load 2090 in a forward-boost mode and transferring small increments of energy from the load 2090 in a reverse-buck mode. A low frequency full-bridge stage 2040, shown inside the dash-dot line, unfolds the folded waveform via four high-voltage switches $M_{3-6}$ to generate a full swing signal (for example, −50V to 50V) across the load 2090. Lastly, an embedded controller 2050, shown inside the dotted line, implements several techniques to achieve low power and low distortion, described further below.

Under a preferred embodiment, the topology of the driver IC 2020 may balance power, size, and performance to enable the use of high voltage actuators with minimal overhead. Referencing the full-bridge stage 2040 to $V_{IN}$ enables low-distortion zero crossings by the power converter stage 2030 with a two-switch ($M_1$, $M_2$) power converter topology to generate voltages above GND. By avoiding four-switch buck-boost or two-switch inverting buck-boost topologies, the driver IC 2020 may have a smaller die area (i.e., two switches) or simpler die biasing (i.e., no negative supply), respectively. Although direct current sensing through an external $R_1$ may dissipate more power, it enables accurate bidirectional inductor current monitoring across all operating conditions.

The embedded controller 2050 may implement multiple techniques to reduce DC loss ($P_{DC}$) and switching loss ($P_{SW}$), and to improve waveform quality. First, a boundary conduction mode (BCM) operation reduces losses and reduces the size of the inductor $L_1$. The size of the inductor may be dependent on the load size. In the exemplary embodiments having 100 Vpp and 200 Vpp outputs, inductors in the range of 10 pH to 100 pH may be used. Moreover, the inductor $L_1$ may be sized to minimize the switching frequency ($f_{SW}$) while achieving a target THD+N and signal bandwidth. A smaller inductor $L_1$ generally increases $f_{SW}$, thus increasing $P_{SW}$, but choosing a smaller value for the inductor $L_1$ may enable the controller to track a reference waveform more accurately, thus reducing the THD+N. A lower value of the inductor $L_1$ also may enable more energy to be transferred to/from the load 2090, thus increasing output signal bandwidth.

Psw may be further reduced by zero voltage switching (ZVS) of, for example, 60V high-voltage switches $M_1$, $M_2$ of the power converter stage 2030 when a ZVS detector 2053 detects a zero voltage condition for a switching node voltage $V_{SW}$ and signals a digital controller 2051. The ZVS detector may be a hardware block that detects when the voltage at node Vsw is below a certain threshold (e.g. 3V). The threshold may be optimized based on the specific implementation to take into account LC resonant frequency of node Vsw and other source of latency in the system hardware. In boost mode, ZVS may occur with conventional synchronous switching. However, in reverse-buck mode the embedded controller 2050 may implement pseudo-resonant synchronous (PRS) operation to enforce ZVS of the second switch $M_2$. The first switch $M_1$ stays on until the current $I_L$ of the inductor $L_1$ reaches a current threshold sufficient to charge the switching node voltage $V_{SW}$ to $V_{FOLDED}$. Hence, the second switch $M_2$ turns on with ZVS and no discontinuity appears in the current waveform. The digital controller 2051 may set the current threshold on a cycle-by-cycle basis to accurately generate the folded waveform while reducing switching losses. The digital controller 2051 may implement an adaptive proportional-integral (PI) algorithm that dynamically adjusts its gains with respect to state variables such as output voltage and switching frequency of the driver 2000, thus, enabling more accurate tracking of the reference waveform over the full range of output voltage at the load 2090.

The digital controller 2051 implements several key functionalities, including an algorithm to track the reference waveform provided through the SPI interface, the management of the different switch control signals to achieve the desired state, and the ability to communicate back to the user the voltage on the output in real time. Since capacitive loads such as piezoelectric actuators also generate a voltage when mechanically stressed, the digital controller 2051 may be configured to read the output and communicate the information to the user. This enables the driver 2000, 2100 to also be used as a sensor which may be useful in systems such as haptic feedback that react based on the mechanical stress applied to the actuator (e.g. a button) or to detect when the actuator operates exactly at its resonant frequency (e.g. fan application).

The digital controller 2051 may provide a state and/or voltage of the output in real-time, and may also optionally provide other functionalities such as handling the different power states of the driver IC 2120. While FIGS. 20 and 21 have single arrows indicating inputs to the digital controller 2051, in general there is some form of information going back to the source block (current feedback 2052, ZVS 2053, ADC 2055, SPI 2054) from the digital controller 2051. The arrows are meant to suggest the "main" flow of information but it is standard that information is communicated bi-directionally. For example, the SPI 2054 if a full-duplex interface, so information may be sent and received by the same link.

A current feedback sensor 2052 provides bidirectional current sensing in all possible switching condition during operation, for example, borderline conduction mode, discontinuous conduction mode and continuous conduction mode. The current feedback sensor 2052 ensures the first switch $M_1$ and the second switch $M_2$ turn on/off at the right time to avoid high switching losses at the Vsw node.

As shown in FIG. 20, the second switch $M_2$ may be an N-type transistor with its source referenced to Vsw. In order to control its gate appropriately, the level shift block 2032 translates a control signal from the digital controller 2051 referenced to ground into a signal referenced to a floating node (Vsw). Under the first embodiment the level shift block 2032 enables scaling of the digital control signal amplitude from a digital logic level to a higher amplitude suitable for the switch $M_2$, for example, scaling from 1.8V to 5V.

The level shift block 2032 may change the reference node for the signal from ground to an arbitrary floating node, in this case, Vsw. While FIG. 20 shows an N-type transistor for the switches $M_1$, $M_2$, in an alternative embodiment a p-type may be used with similar requirement for a level shift block. For p-type switch transistors, the level shift block 2032 may use a floating bootstrap supply (not shown) to provide the desired level for the output of the level shift block 2032.

It is desirable that the differential signal (Vout+−Vout−) be very clean. However, it is not necessary for the signal at either Vout+ or Vout to be referenced to ground. A difference amplifier 2056 measures continuously the differential voltage between Vout+ and Vout− and converts the difference to a single-ended signal fed to an analog-to-digital converter (ADC) 2055 which provides a digital representation of the output to the digital controller 2051.

At the output of the full-bridge stage 2040 output a third switch $M_3$, a fourth switch $M_4$, a fifth switch $M_5$, and/or a sixth switch $M_6$ be viewed as on or off low resistance switches during operation, as they do not affect significantly the quality of the output. This may be leveraged by connecting the difference amplifier 2056 between the $V_{FOLDED}$ node and the $V_{IN}$ node instead of directly to Vout+ and Vout−. This may simplify the feedback because the input of the difference amplifier 2056 is always positive. This provides two benefits for single die integration: (1) a simple difference amplifier 2056 may be used which saves die area compared to a fully differential amplifier or a difference amplifier requiring a positive and negative supply to cover the bipolar input, and (2) using the configuration shown in FIG. 20, the common mode rejection ratio of the amplifier may be relaxed as the common mode may be fixed at a value defined by $V_{IN}$ (DC voltage) and the feedback ratio. This also benefits size and power consumption of the amplifier block.

FIG. 20 shows four main inputs to the digital controller 2051. In alternative embodiments, there may be more or fewer inputs to the digital controller 2051. A serial peripheral interface (SPI) 2054 is a communication protocols that enables an external microcontroller (or other device, for example, a computer) to send/receive information to/from the driver 2000 via the digital controller 2051 such as a reference waveform and internal settings used for the particular implementation. It should be noted SPI is an example of one of several digital communication protocols that may be implemented to interface with the digital controller 2051. Other examples of a communication interface include, but are not limited to I2C, TDM, and I2s.

The current feedback sensor 2052 provides the digital controller 2051 with information about the current flowing through the inductor L1 at any time. The digital controller 2051 is configured to use this information to decide when to switch the switches $M_1$, $M_2$. The ZVS detector provides information on the instantaneous voltage at the switching node Vsw. The information may be used by the digital controller 2051 differently depending if the driver 200 is operated in DCM, BCM or CCM and depending on the direction of the average current flow. The ADC 2055 provides a digital representation of the output. Coupled with the information the digital controller 2051 already has on the state of the full-bridge stage 2040, the digital controller 2051 may use the input signal from the ADC 2055 to calculate the error on the output voltage compared to the reference waveform sent through the SPI 2054.

Figure 21:
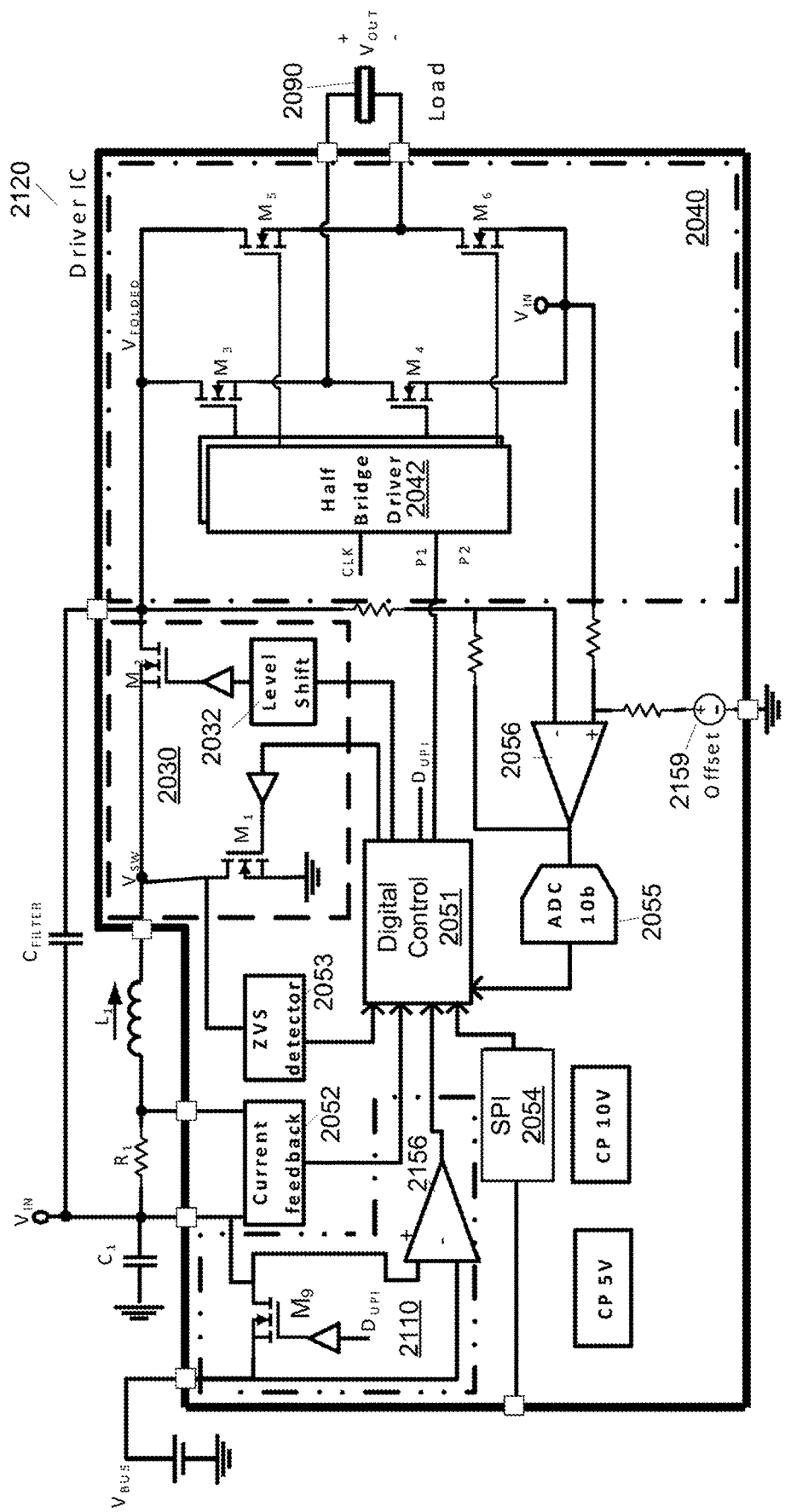
FIG. 21 is a schematic drawing of a variation on the driver of FIG. 20 including an alternative input section.

FIG. 21 shows a variation 2100 of the driver 2000 of FIG. 20. The variation 2100 is based on the driver 2000 (FIG. 20), and includes an implementation of a driver IC 2120 using the unidirectional power input 720 from FIG. 6B. Here, $V_{IN}$ is at the main power supply of the chip (on the chip side of the unidirectional power input switch $M_9$). $V_{BUS}$ indicates a generic voltage source in a system supplying current to many chips/subsystems. Compared with FIG. 20, FIG. 21 shows implementing the driver IC 2120 with a unidirectional power input stage 2110 according to the unidirectional power input 720 (FIG. 6B), where the active switch 721 (FIG. 6B) is implemented as the ninth switch $M_9$ and a difference amplifier 2156 providing an output that is received as an input to the digital controller 2051. Here, the input voltage $V_{BUS}$ is fed through the unidirectional power input stage 2110 with the ninth switch $M_9$ to $C_1$ which becomes the point in FIG. 21 that is equivalent to Vin in FIG. 20 and the difference amplifier 2156 shown within dotted lines.

A 5V charge pump 2157 may create a stable supply (e.g. 5V) higher than $V_{IN}$ to power different blocks in the driver IC 2120. In the exemplary embodiment, the 5V charge pump 2157 may power the difference amplifier 2156, which enables the difference amplifier 2156 to have in input voltage range of up to 5V to improve its signal over noise ratio. The 5V charge pump 2157 may also provide a reference voltage in the scheme used to control the full-bridge stage 2040.

A 10V Charge Pump 2158 may create a floating supply on top of $V_{IN}$ of an amplitude equal to the 5V charge pump 2157. For instance if $V_{IN}$=3.6 V and the output of the 5V charge pump 2157 is 5V, than the output of 10V Charge Pump 2158 will be at 8.6V referenced to GND and 5V referenced to $V_{IN}$. This voltage level may be useful to drive the low side devices of the full-bridge output (the fourth switch M4 and the sixth switch M6) and also enables the use of an n-type transistor for the ninth switch (unidirectional power input switch) $M_9$ at a voltage considerably higher than $V_{IN}$ to enable a low resistance path between $V_{IN}$ and C1.

An offset block 2159 can be implemented in many ways, for example, to offset the output of the difference amplifier 2056 by an offset value. Under the first embodiment, when the differential output is 0, the output of the amplifier is Voffset. When the differential output is Vx, the output of the difference amplifier is Voffset−Vx/feedback ratio. Without the offset, the difference amplifier 2056 connection would need to be flipped to get a positive output and the common mode of the amplifier would vary greatly in operation. It should be noted that embodiments may incorporate several common level shift blocks and other blocks that are not shown in FIGS. 20 and 21 for purposes of clarity.

Figure 22:
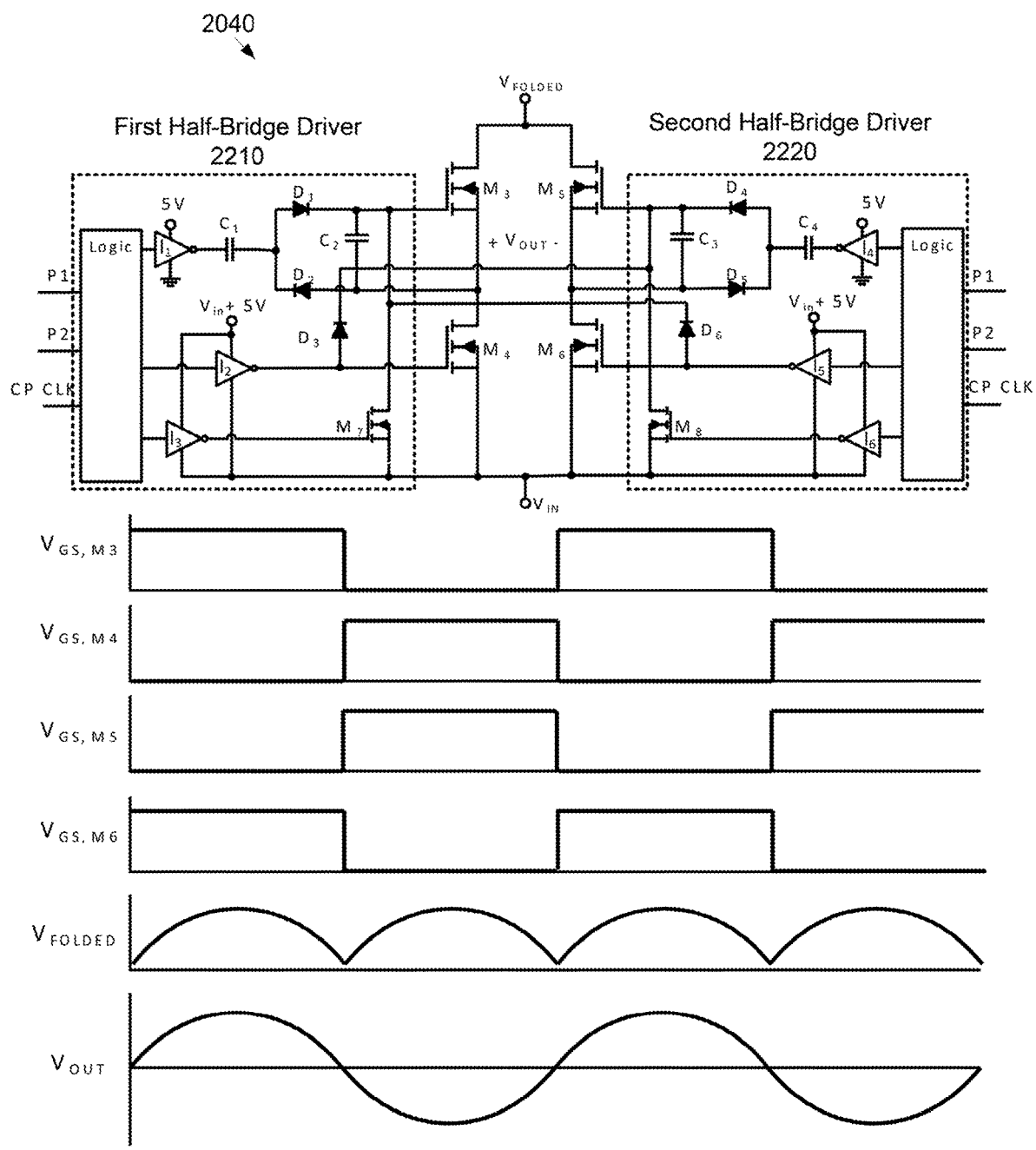
FIG. 22 is a schematic drawing of a detail of the full-bridge stage of FIG. 20 and associated voltage plots.
Figure 23:
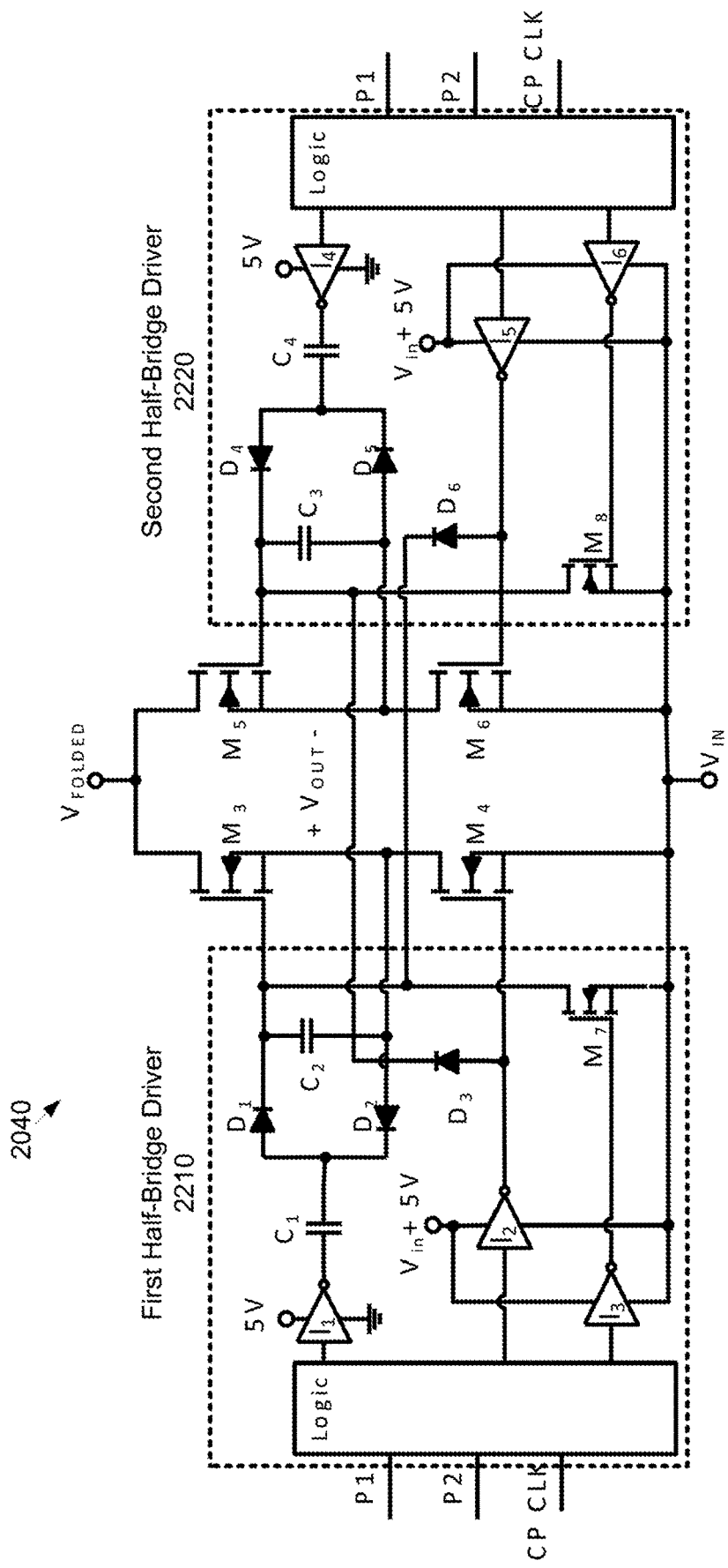
FIG. 23 is a larger rendering of the circuit of FIG. 22.
Figure 24:
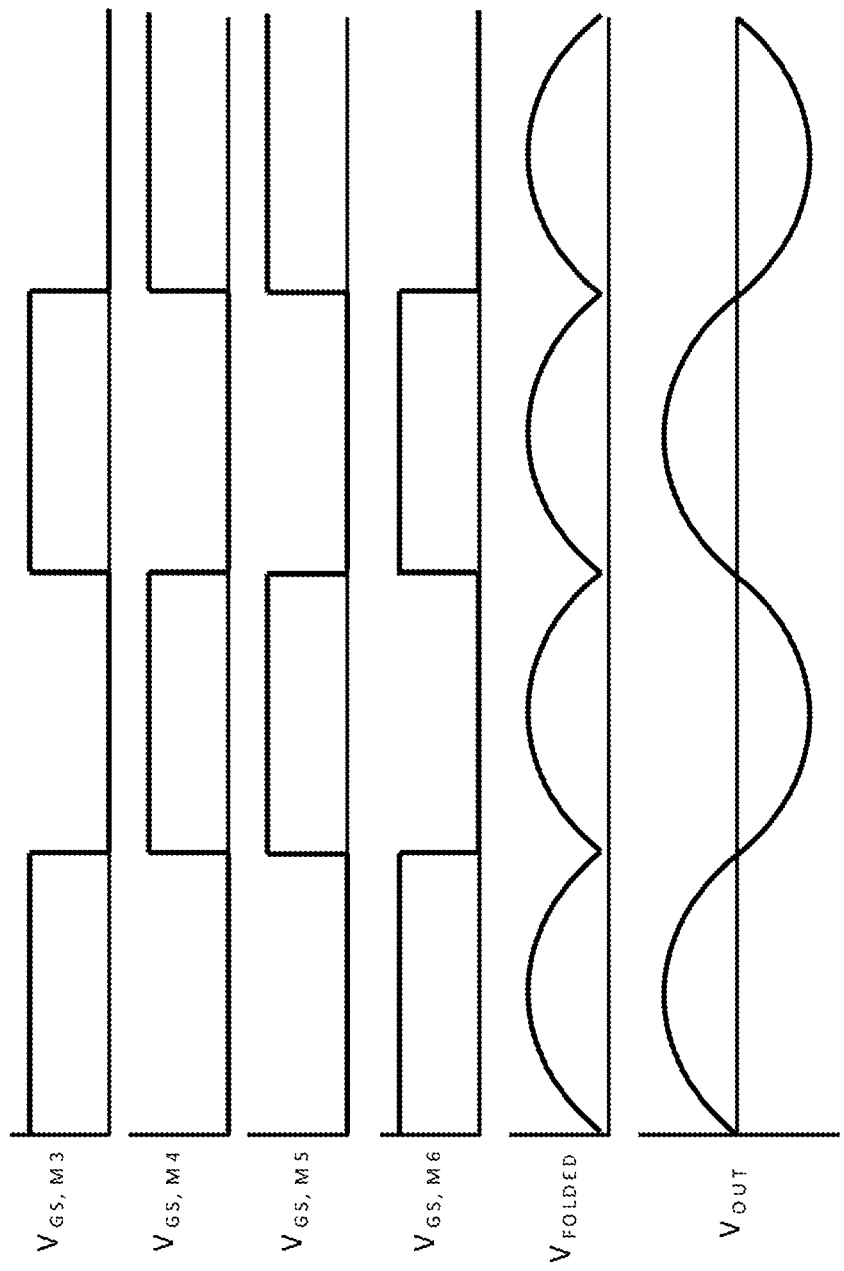
FIG. 24 is a larger rendering of the voltage plots of FIG. 22

FIGS. 22-24 present a detailed view of the full-bridge stage 2040 and its drivers. Since high-voltage transistors (switches) $M_{3-6}$ switch at a low rate (on the order of hundreds 100s of times per second/at the same frequency or at a lower frequency than the output waveform) to construct the final waveform ($V_{OUT}$), the two half-bridge drivers 2042 may be small, incurring minimal area penalty, for example, on the order of 0.5% of die area of a 2.2 mm² die for the exemplary embodiments.

To avoid the complexities of conventional high-side drivers, the driver IC 2120 may use a compact charge pump ($C_1$, $D_1$, and $D_2$) to drive and maintain $V_{GS, M3}$ at the desired bias voltage, for example, approximately 4V when the third switch M3 is ON for this embodiment. This configuration may generate arbitrary waveforms (including DC) with, for example 100 Vpp amplitude.

Low power, small size, and good signal fidelity have significant impact at the system level. Multi-actuator haptic feedback systems for wearables struggle to handle the power budget and heat dissipation from available actuator drivers. In the case of a piezo fan, low power consumption is essential for the use of the fan in portable electronics. Good signal fidelity is critical for piezo fans in order to achieve low acoustic noise operation: a requirement in most applications. Signal bandwidth up to 300 Hz is sufficient in those applications. It avoids generating noise (fan) and corresponds to the bandwidth where humans are the most sensitive to vibrations (haptic). Higher signal bandwidth, slew rates, and output voltage ranges may be achieved by scaling the design for other applications such as piezo speakers.

Exemplary embodiments of an 8-bit successive approximation register (SAR) analog-to-digital converter (ADC) offer a low energy area product (EAP) to minimize the ADC footprint and extend the single-ended input range two times the power supply voltage to enable direct connection to sensors. This reduced size and power implementation may facilitate integration within a multicore "brain" system-on-chip (SoC) such as the one shown in FIG. 28, for example, for controlled flight. To enable direct sensor connection to the SoC powered off a 0.9V supply ($V_{DD}$), 1.8V analog input range is desirable.

Exemplary converter embodiments described below provide hybrid, extended-range digital to analog converters (DAC) with (i) a hybrid combination of split-capacitor and sub-DAC techniques to further reduce area and power consumption compared to previous techniques and (ii) an extended-range technique that doubles the single-ended input voltage range while operating off of a low $V_{DD}$ to maintain power savings.

Figure 25A:
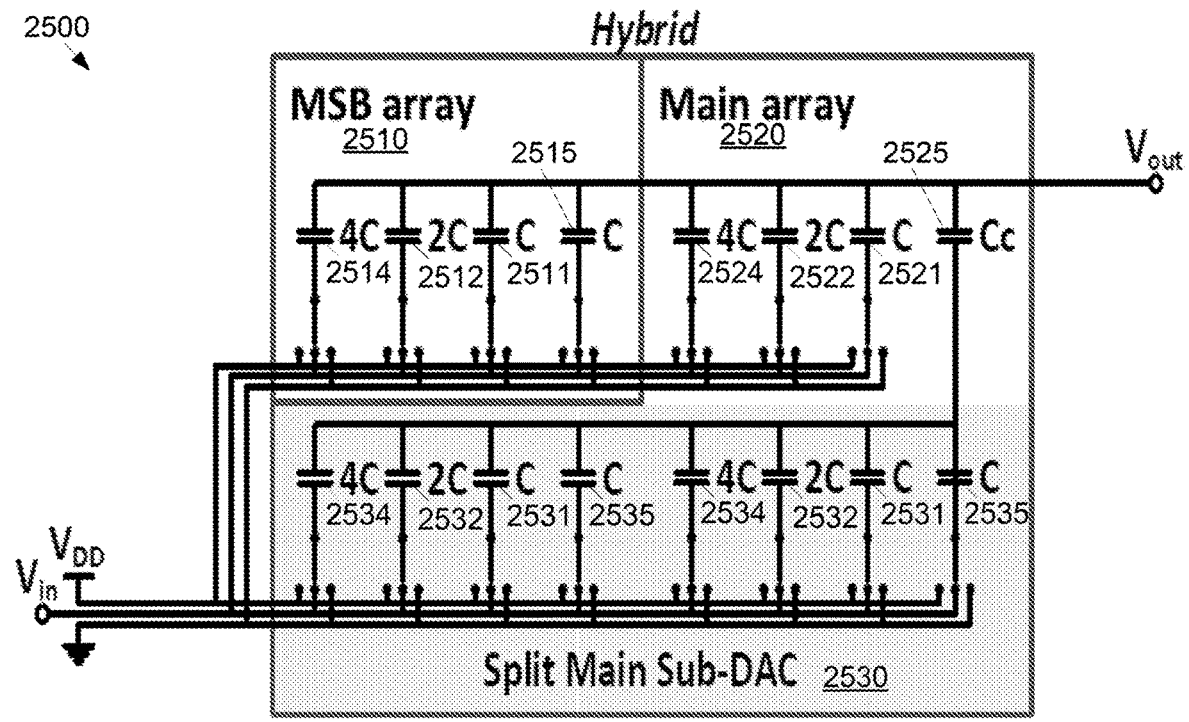
FIG. 25A is a schematic diagram of an exemplary embodiment of a hybrid split main sub-DAC circuit.
Figure 25B:
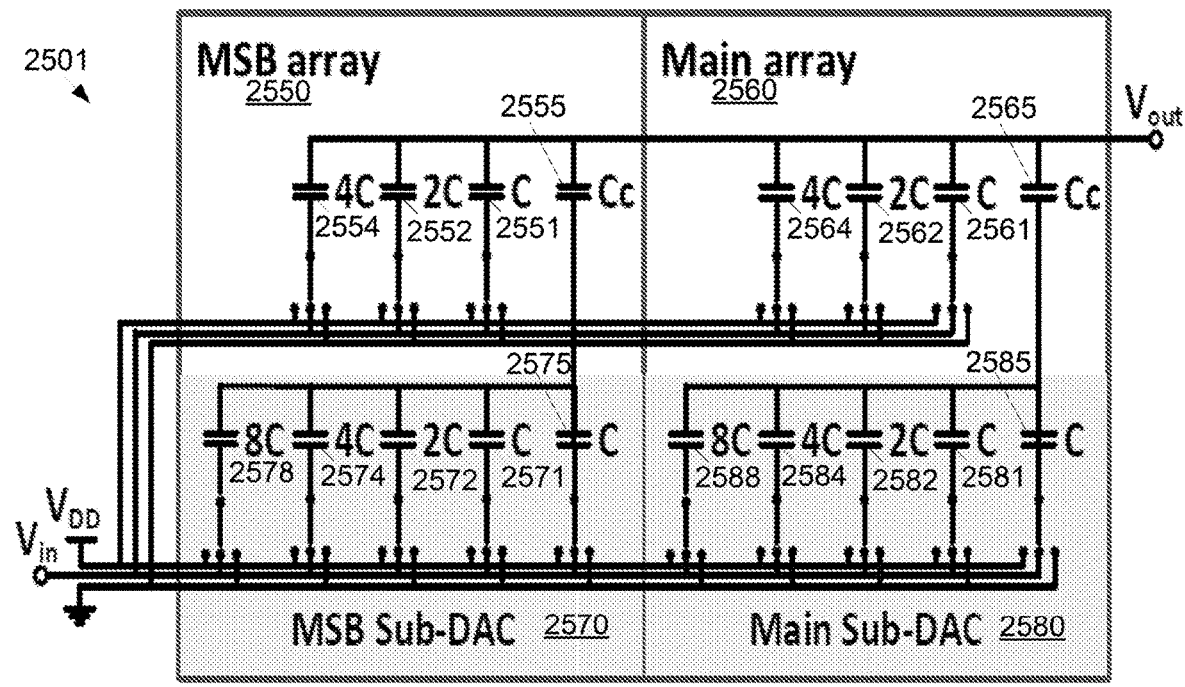
FIG. 25B shows a prior art strict implementation DAC having two identical sub-DAC circuits.

FIG. 25A shows a digital-to-analog converter (DAC) embodiment 2500 implementing an 8b DAC using a hybrid split-capacitor sub-DAC 2530, while FIG. 25B shows a strict implementation 2501 having two identical sub-DACs: an MSB (most significant bit) sub-DAC 2570 and a main sub-DAC 2580.

In general, under the strict implementation 2501 the MSB capacitor array 2550 and the main capacitor array 2560 each have a capacitor for each conversion bit: a bit 4 capacitor 2554, 2564, a bit 2 capacitor 2552, 2562, and a bit 1 capacitor 2551, 2561, as well as an MSB array coupling capacitor 2555 coupling the MSB array 2550 to the MSB sub-DAC 2570 and a main array coupling capacitor 2565 coupling the main array 2560 to the main sub-DAC 2580. Similarly, under the DAC embodiment 2500 with the hybrid approach, the MSB array 2510 and the main array 2520 each have a capacitor for each conversion bit: a bit 4 capacitor 2514, 2524, a bit 2 capacitor 2512, 2522, and a bit 1 capacitor 2511, 2521. However, while the main array 2520 includes a coupling capacitor 2525 coupling the main array 2520 to the split main sub-DAC 2530, the MSB array 2510 omits a coupling capacitor, and instead includes a unit capacitor 2515.

The split-capacitor sub-DAC 2530 of the DAC embodiment 2500 removes the area penalty resulting from a strict split sub-DAC implementation, in particular the MSB sub-DAC 2570, while reducing the switching energy consumed.

Like the Split Main Sub-DAC 2530 of the DAC embodiment 2500, the combination of the MSB Sub-DAC 2570 and the main Sub-DAC 2580 each have two bit 4 capacitors (2534 for the DAC embodiment 2500 and 2574 and 2584 for the strict implementation 2501), two bit 2 capacitors (2532 for the DAC embodiment 2500 and 2572 and 2582 for the strict implementation 2501), two bit 1 capacitors (2531 for the DAC embodiment 2500 and 2571 and 2581 for the strict implementation 2501), and two unit coupling capacitors (2535 for the DAC embodiment 2500 and 2575 and 2585 for the strict implementation 2501). However, the DAC embodiment 2500 removes the MSB sub-DAC 2570 of the strict implementation 2501 and replaces the coupling capacitor Cc 2555 in the MSB array 2550 with a unit capacitor C 2515. The DAC embodiment 2500 splits out the bit 8 capacitor 8C 2588 from the main sub-DAC 2580 to create the split main sub-DAC 2530. Assuming the value of coupling capacitor Cc 2555 is on the order of the unit capacitor C 2575, the area of a strict implementation 2501 is $$A_{strict}=(2^M+2^{S+1})C \quad (Eq. 3)$$

where M represents the number of bit of the main sub-DAC 2580 and S the number of bits of the MSB sub-DAC 2570. In contrast, for the DAC embodiment 2500, the area equation is $$A_{hybrid}=(2^M+2^S)C \quad (Eq. 4).$$

As a result of having fewer capacitors, for an 8 bit DAC, under the DAC embodiment 2500 the area for a single-ended DAC with 4b sub-DACs decreases from 48 C to 32 C, removing 33.3% of the original capacitor area. Overall, the DAC embodiment 2500 significantly reduces total ADC area since the capacitor banks consume a large fraction of area in a SAR ADC, about 50% in the exemplary embodiment.

The DAC embodiment 2500 does not compromise mean switching energy and is 3.5% lower than in the strict implementation 2501. The switching algorithm follows a traditional split capacitor algorithm, however a conventional transition occurs when the LSB capacitor of the MSB array must be lowered. Despite this "conventional" transition, the overall switching energy of the DAC embodiment 2500 is lower than the strict implementation 2501. During the operation of the Split Main Sub-DAC 2530, less charge needs to move compared to the split capacitor method on two sub-DACs 2570, 2580 connected through two coupling capacitors 2555, 2565. Hence, the DAC embodiment 2500 procures a slight energy reduction compared with the strict implementation 2501.

In order to extend the single-ended input range, two hybrid DACs 2500 (FIG. 26) may be combined as a ADC 2600 in a pseudo-differential bipolar manner via a comparator 2640 and SAR logic 2650, with the a first hybrid DAC 2610 and a second hybrid DAC 2620 connected in series through a switch ($SW_{series}$) and DAC2 2620 referenced to $V_{DD}$ during sampling similar to a dynamic folding range technique. In this configuration, the second hybrid DAC 2620 does not need a Vin input since it is not used for single-ended operation.

Figure 26:
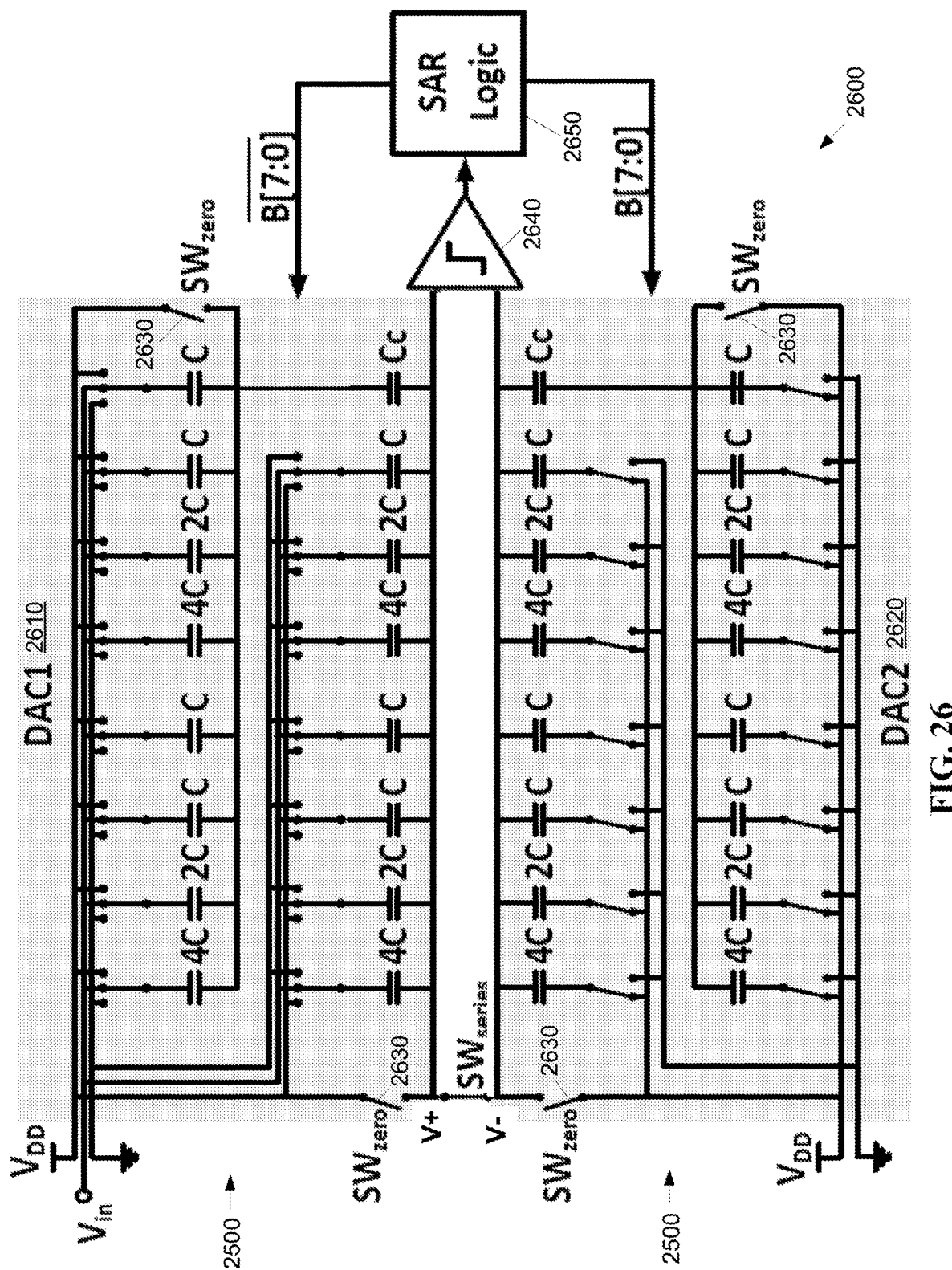
FIG. 26 is a schematic diagram of an exemplary embodiment of an extended range SAR ADC combining two hybrid DACs of FIG. 25A.
Figure 27:
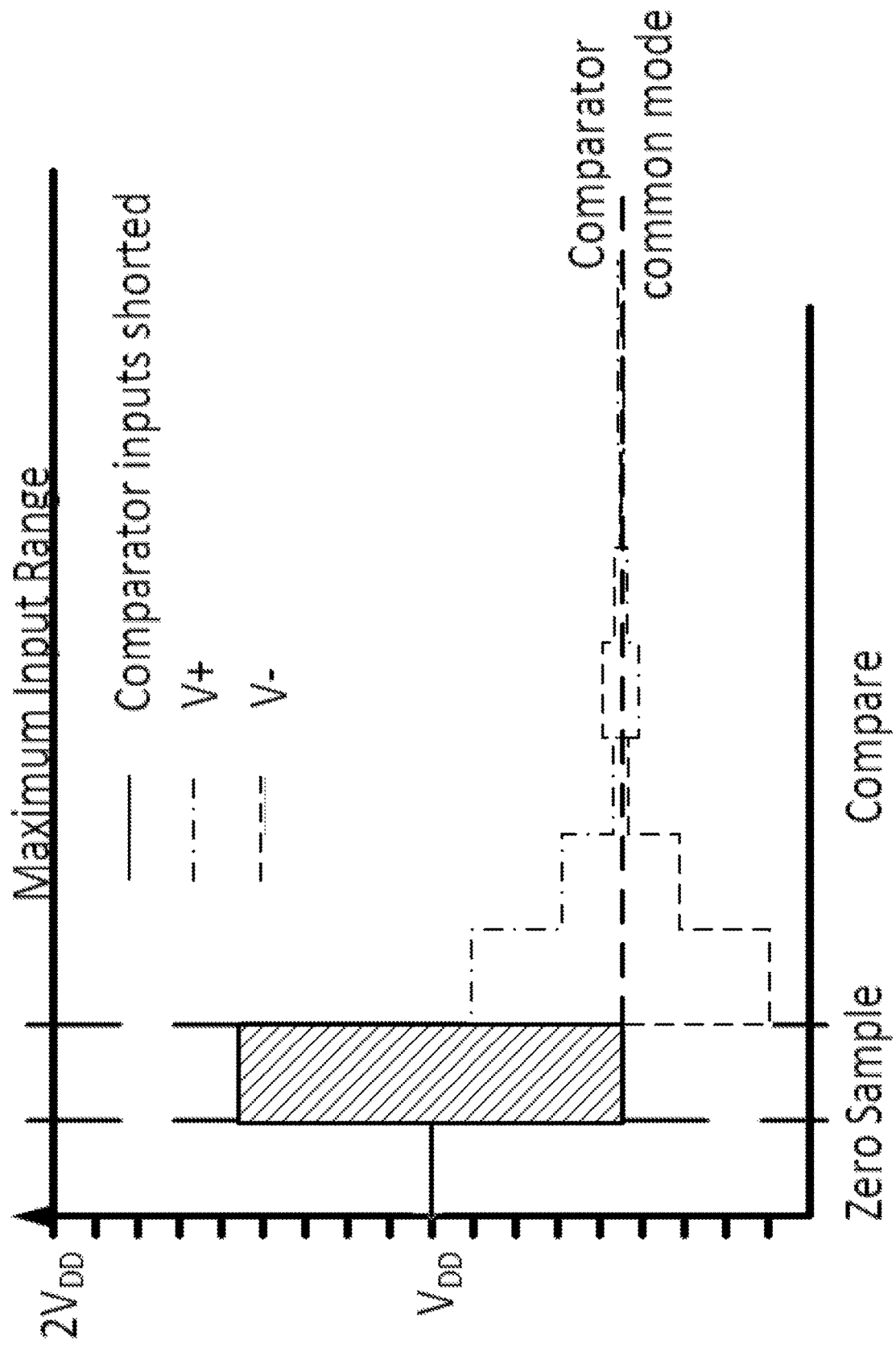
FIG. 27 is a plot showing the evolution of the comparator input voltage through a full conversion cycle for the ADC of FIG. 26.

FIG. 27 shows the evolution of the comparator input voltage through a full conversion cycle with reference to the ADC 2600 of FIG. 26. During the zero phase, all capacitors are shorted to $V_{DD}$ through $SW_{zero}$. In the sample phase, the first hybrid DAC 2610 and the second hybrid DAC 2620 are connected in series through $SW_{series}$ and the second hybrid DAC 2620 is referenced to $V_{DD}$. For an input range of 2 $V_{DD}$, the comparator inputs vary from $V_{DD}/2$ (when the input is 0V) to 3 $V_{DD}/2$ (when the input is 2 $V_{DD}$). This allows for a maximum of plus or minus 0.45V on each DAC 2500 without reducing the LSB size. Compared to an ADC that requires a voltage divider to scale down the input voltage, this technique provides 2 times larger signals at the comparator inputs. When the sample phase terminates, the first hybrid DAC 2610 and the second hybrid DAC 2620 are disconnected from one another. At the same time, the MSB array of the first hybrid DAC 2610 and the main array of the second hybrid DAC 2620 are connected to GND. This places the common mode between the first hybrid DAC 2610 and the second hybrid DAC 2620 at $V_{DD}/2$ and ensures that the comparator input voltage range stays within $V_{DD}$. At this point, all the bits resolve as if the ADC is a differential ADC. The common mode is constant at $V_{DD}/2$ during comparison steps, thus, simplifying the comparator design operating off a $V_{DD}$ supply.

The extended algorithm also reduces the energy required by using a reference value of half the input range compared to a reference equal to the full input range in a conventional single-ended design. Since the energy is proportional to $V_2$ ref, DAC energy reduces by a factor of four. However, since two DACs are used, the overall energy is reduced by a factor of two. Care should be taken on how $V_{ref}$ is generated to achieve these energy savings. The energy for a transition may be given by Eq. 5:

$$E_{transition} = \int i_{ref}(t) V_{ref} dt \propto \alpha C V_{ref}^2 \qquad (Eq.\ 5)$$

where α is a factor based on the exact transition and C is the value of a unit capacitor in the array. Eq. 5 shows that the quadratic relationship of $V^2_{ref}$ is linked to two key factors: the voltage level of $V_{ref}$ and the total current drawn from $V_{ref}$, i.e., the quantity of charge (Q). No matter how $V_{ref}$ is generated, the current level scales with the value of $V_{ref}$ as less charge will move in the capacitive DAC. However, if $V_{ref}$ is generated by a lossy mechanism, such as an LDO, the value of the input voltage source must be used to calculate the effective energy requirement.

Generally speaking the ADC 2600 of FIG. 26 is more energy efficient than stepping up $V_{DD}$ to sample inputs higher than $V_{DD}$. However, before using this method for the strict purpose of saving energy, it is desirable that detailed analysis be performed to determine its performance at the system level.

Figure 28:
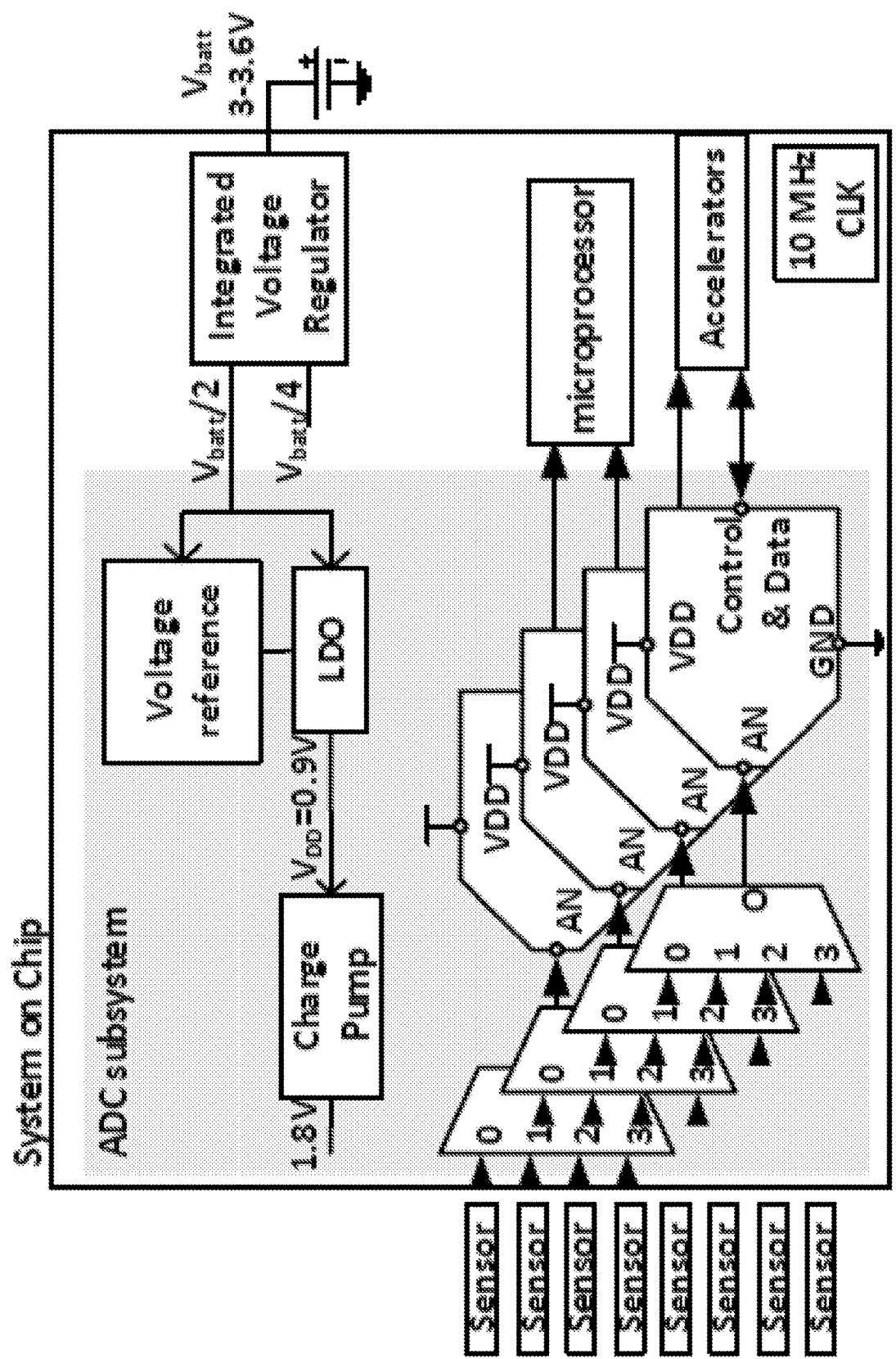
FIG. 28 is a schematic diagram providing an overview of an exemplary implementation of the ADC of FIG. 26 embedded within a system on a chip (SoC).

FIG. 28 provides an overview of the ADC subsystem embedded within a SoC having four independent ADC cores that accept up to 16 analog inputs via four 4:1 analog multiplexers. An integrated voltage reference and LDO circuitry create a process, voltage, temperature (PVT) independent 0.9V $V_{DD}$ supply from a $V_{batt}/2$ supply provided by an integrated voltage regulator in the SoC. An on-chip charge pump doubles the $V_{DD}$ input to bootstrap included switches and provide reliable input sensing up to 1.8 V. A 10 MHz fixed-frequency clock source within the SoC sets the ADC clock, which imposes a maximum sampling rate of 1 MS/s per ADC since each conversion takes 10 steps.

So implemented, the ADC can dynamically adjust the sampling time from 100 ns to 800 ns in order to accommodate different sensor output impedances. Consequently, the sampling rate reduces to 588.2 kS/s for the 800 ns sampling time.

Sized for a 8b implementation, an exemplary ADC core may occupy, for example, 0.00986 mm² without the 4:1 analog multiplexers. The capacitor arrays may use 44 fF metal-oxide-metal (MOM) unit capacitors for a total equivalent input capacitance of 352 fF. The number of converted bits may be scaled up or down depending on specific ADC requirements in the system.

An exemplary complete ADC subsystem including four ADC channels multiplexed to 13 input pads, an LDO, bandgap, and charge pump (CP) occupies 0.0655 mm². The hybrid extended-range design may use a StrongArm latch comparator (Comp) built using low-voltage, thin oxide devices.

The extended range ADC accepts a signal with higher amplitude than a strict implementation ADC, which is important in an IC where the power devices switch up to for example 100V. Too much noise at the ADC input would jeopardize the proper functionality of the circuit.

The embodiments described above may preferably drive a capacitive load, for example, (but not limited to) piezoelectric actuators, electroactive polymer actuators, or electrostatic actuators. In view of the foregoing, it is intended that the present invention cover modifications and variations of this invention provided they fall within the scope of the following claims and their equivalents.

What is claimed is:

1. An analog to digital converter (ADC) 2600 comprising:
   a first single ended n-bit hybrid digital-to-analog converter (DAC) (2610) switchably referenced to an input voltage ($V_{IN}$) and a supply voltage ($V_{DD}$);
   a second single ended n-bit hybrid digital-to-analog converter (DAC) (2620) switchably referenced to the input voltage and connected in series to the first DAC via a switch ($SW_{series}$);
   a comparator configured to receive a first output from the first DAC and a second output from the second DAC; and
   a successive approximation register (SAR) (2650) configured to provide an n-bit output to the second DAC and a complement of the n-bit output to the first DAC, wherein n is a positive integer and the first DAC and the second DAC are combined in a pseudo-differential bipolar manner.

2. The ADC of claim 1, wherein n is in the range of 4 to 16.

* * * * *